(12) United States Patent
Lin et al.

(10) Patent No.: US 8,599,181 B2
(45) Date of Patent: Dec. 3, 2013

(54) DISPLAY PANEL

(75) Inventors: Yu-Min Lin, Hsin-Chu (TW); Hsin-Li Chen, Hsin-Chu (TW); Feng-Yuan Gan, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/227,455

(22) Filed: Sep. 7, 2011

(65) Prior Publication Data

US 2011/0316830 A1    Dec. 29, 2011

Related U.S. Application Data

(62) Division of application No. 11/943,602, filed on Nov. 21, 2007, now Pat. No. 8,054,304.

(30) Foreign Application Priority Data

Jul. 27, 2007   (TW) .............................. 96127644 A

(51) Int. Cl.
G06F 3/038    (2013.01)

(52) U.S. Cl.
USPC ............ 345/207; 257/292; 257/432; 349/116

(58) Field of Classification Search
USPC .......... 345/207, 173, 175; 356/3.06; 257/462, 257/59, 72, 83, 84, 292, 432, 290, 291, 431, 257/461, 444, 440; 349/116
See application file for complete search history.

(56) References Cited

U.S. PATENT DOCUMENTS

| | | | |
|---|---|---|---|
| 6,087,648 A * | 7/2000 | Zhang et al. | 250/208.1 |
| 6,777,254 B1 | 8/2004 | Yamazaki | |
| 6,953,978 B2 * | 10/2005 | Chang et al. | 257/432 |
| 7,242,449 B1 * | 7/2007 | Yamazaki et al. | 349/116 |
| 2001/0055008 A1 * | 12/2001 | Young et al. | 345/204 |
| 2002/0027229 A1 * | 3/2002 | Yamazaki et al. | 257/84 |
| 2002/0093474 A1 * | 7/2002 | Toyoshima et al. | 345/87 |
| 2002/0190253 A1 * | 12/2002 | Tsujimura et al. | 257/59 |
| 2003/0141504 A1 * | 7/2003 | Kuwabara et al. | 257/66 |
| 2004/0217357 A1 * | 11/2004 | Zhang et al. | 257/72 |
| 2004/0222420 A1 * | 11/2004 | Chang et al. | 257/59 |
| 2004/0222467 A1 | 11/2004 | Yamazaki | |
| 2004/0266075 A1 * | 12/2004 | Chen | 438/154 |
| 2005/0176194 A1 * | 8/2005 | Sasaki et al. | 438/197 |
| 2006/0132401 A1 * | 6/2006 | Yamazaki et al. | 345/81 |
| 2007/0138951 A1 * | 6/2007 | Park et al. | 313/504 |
| 2008/0158137 A1 * | 7/2008 | Yoshida | 345/102 |

* cited by examiner

Primary Examiner — Koosha Sharifi-Tafreshi
(74) Attorney, Agent, or Firm — Winston Hsu; Scott Margo

(57) ABSTRACT

A photo detector is disclosed. The photo detector includes a substrate, a first patterned semiconductor layer, a dielectric layer, a patterned conductive layer, an inter-layer dielectric, a second patterned semiconductor layer, two first electrodes disposed on the inter-layer dielectric and two second electrodes disposed on portions of the second semiconductor layer. The first patterned semiconductor layer having a first doping region and a second doping region is disposed on a transistor region. The dielectric layer is disposed to cover the substrate and the first semiconductor layer, the patterned conductive layer is disposed on the dielectric layer, and the inter-layer dielectric having at least two openings adapted to expose the first doping region and the second doping region is disposed to cover the dielectric layer. The second patterned semiconductor layer is disposed on a photosensitive region and the first electrodes are electrically connected to the first patterned semiconductor layer.

12 Claims, 21 Drawing Sheets

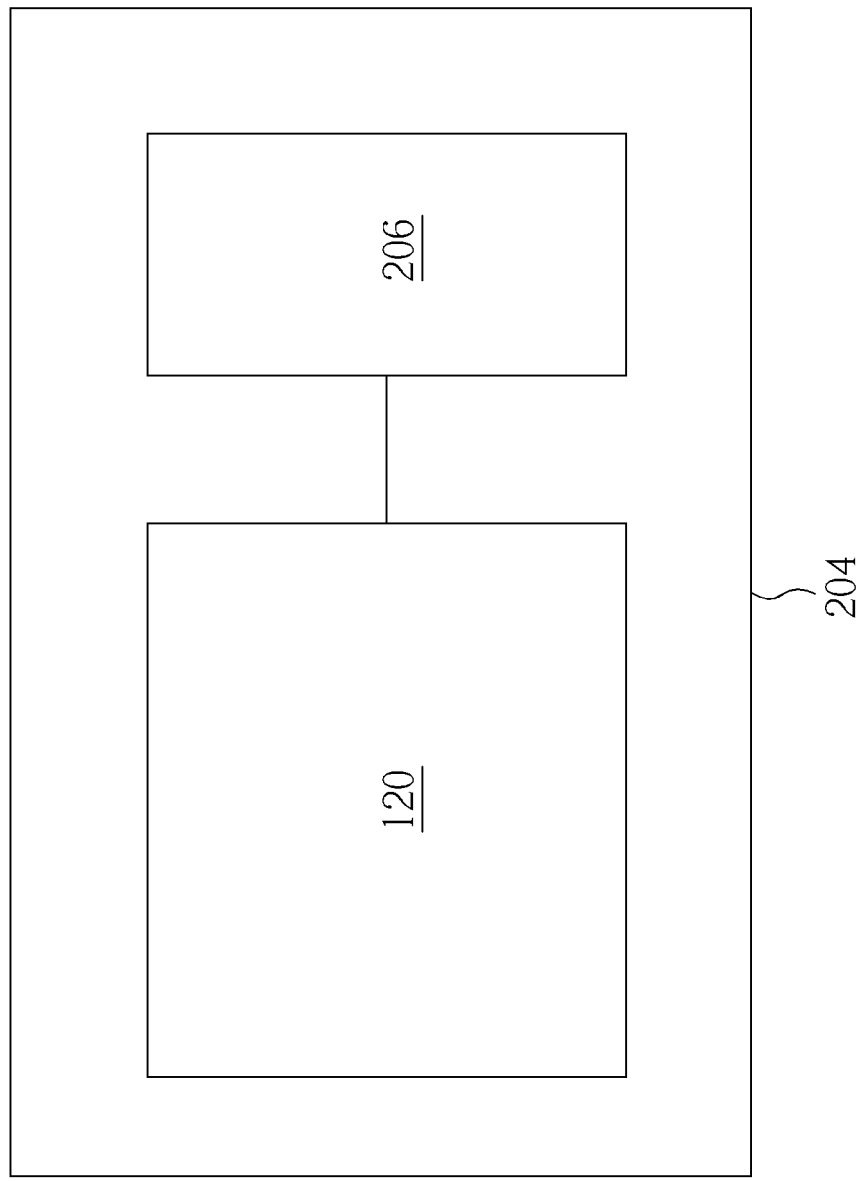

DISPLAY PANEL

CROSS REFERENCE TO RELATED APPLICATIONS

This application is a division of U.S. application Ser. No. 11/943,602 filed Nov. 21, 2007, and incorporated herein by reference in its entirety.

BACKGROUND OF THE INVENTION

1. Field of the Invention

The present invention relates to a photo detector.

2. Description of the Prior Art

Flat panel displays are widely employed in various consumer products such as liquid crystal displays, liquid crystal televisions, plasma televisions, cellular phones, personal digital assistants (PDA), digital cameras, display panel of portable game machines, and touch panel of automatic transaction machines. Hence, how to increase the color and brightness of the flat panel display has become an important task. Most of today's displays, especially in various touch panels, include photo detectors for detecting ambient lights. By having color and brightness of the display would adjust according to ambient lights, consumers would perceive a much better visual experience.

Referring to FIG. 1, FIG. 1 illustrates a schematic view of a touch panel according to the prior art. As shown in FIG. 1, a conventional touch panel typically includes a top substrate 12, a bottom substrate 14, a black matrix layer 38 disposed on a portion of the top substrate 12, and at least a photo detector disposed on the bottom substrate 14. The photo detector is composed of a thin film transistor 18 and a photo diode 16. The photo diode 16 includes a p-type doping region 20, an n-type doping region 22, and an intrinsic region 24 disposed between the p-type doping region 20 and the n-type doping region 22. The thin film transistor 18 disposed adjacent to the photo diode 16 includes source and drain regions 26, lightly doped source and drain regions 28, an intrinsic region (not shown) disposed between the lightly doped source and drain regions 28, a gate dielectric layer 30, a gate 32, an interlayer dielectric layer 34 disposed on the source and drain regions 26 and the lightly doped source and drain regions 28, and two electrodes 36 electrically connected to the source and drain regions 26. Additionally, the gate dielectric layer 30 and the interlayer dielectric layer 34 are disposed to cover the photo diode 16.

Typically, the photo detector disposed on the bottom substrate changes the voltage of the storage capacitor when a finger reflects the light emitted by the light source of the backlight module. The relationship between the electrical current of the photo detector and the magnitude of the photo sensitivity is therefore a critical criterion to determine the effectiveness of a touch panel. However, most of the photo detectors in today's touch panels either lack sensitivity to ambient lights or have insufficient photo-electrical current. The cause for these problems is usually a result of using polysilicon semiconductor materials having uniform crystal lattice structure to fabricate the p-type doping region 20, the n-type doping region 22, the intrinsic region 24, the source and drain region 26s, the lightly doped source and drain regions 28, and the intrinsic region (not shown) disposed between the lightly doped source and drain regions 28. Despite the fact that the material made of polysilicon semiconductor has the advantage of having high speed for electron mobility and strong electrical stability, it still has the risk of causing aforementioned problems. Hence, how to improve the current fabrication to effectively increase the photosensitivity and photo-electrical current of photo detector has become an important task.

SUMMARY OF THE INVENTION

It is an objective of the present invention to provide a photo detector and method for fabricating the same.

A photo detector is disclosed, in which the photo detector includes a substrate having a transistor region and a photosensitive region, a first patterned semiconductor layer having a first crystal state, a dielectric layer, a patterned conductive layer, an interlayer dielectric layer, a second patterned semiconductor layer having a second crystal state, two first electrodes formed on the interlayer dielectric layer, and two second electrodes formed on the second patterned semiconductor layer. The first patterned semiconductor layer is disposed on the transistor region of the substrate, in which the first patterned semiconductor layer includes a first doping region and a second doping region. The dielectric layer is disposed to cover the first patterned semiconductor layer of the transistor region and the substrate; the patterned conductor layer is formed on the dielectric layer of the transistor region and the photosensitive region; the interlayer dielectric layer is disposed to cover the dielectric layer and the patterned conductive layer, in which the interlayer dielectric layer includes at least two openings to expose a portion of the first doping region and the second doping region of the first patterned semiconductor layer. The second patterned semiconductor layer is disposed on the photosensitive region of the substrate.

A method for fabricating a photo detector is disclosed, in which the method includes: providing a substrate having a transistor region and a photosensitive region; forming a first patterned semiconductor layer having a first crystal state on the transistor region of the substrate, wherein the first patterned semiconductor layer comprises a first doping region and a second doping region; covering a dielectric layer on the substrate and the first patterned semiconductor layer; forming a patterned conductive layer on the dielectric layer of the transistor region and the photosensitive region; covering an interlayer dielectric layer on the dielectric layer and the patterned conductive layer, wherein the interlayer dielectric layer comprises at least two openings to expose a portion of the first doping region and the second doping region of the first patterned semiconductor layer; forming a second patterned semiconductor layer having a second crystal state on the photosensitive region of the substrate; forming two first electrodes on the interlayer dielectric layer, wherein the first electrodes are electrically connected to the first patterned semiconductor layer; and forming two second electrodes on the portion of the second patterned semiconductor layer.

A display panel having a display area and a non-display area is disclosed. The display panel includes a plurality of pixels disposed in the display area, at least one driving circuit electrically connected to the pixels, and at least one photosensitive region having at least one photo detector electrically connected to the at least one driving circuit. The photo detector includes a substrate having a transistor region and a photosensitive region, a first patterned semiconductor layer having a first crystal state, a dielectric layer, a patterned conductive layer, an interlayer dielectric layer, a second patterned semiconductor layer having a second crystal state, two first electrodes formed on the interlayer dielectric layer, and two second electrodes formed on the portion of the second patterned semiconductor layer. The first patterned semiconductor layer is disposed on the transistor region of the substrate, in which the first patterned semiconductor layer also includes a first doping region and a second doping region. The dielectric layer is disposed to cover the first patterned semiconductor layer of the transistor region; the patterned conductor layer is formed on the dielectric layer of the transistor region and the photosensitive region; the interlayer dielectric layer is disposed to cover the dielectric layer and the patterned conductive layer, in which the interlayer dielectric layer includes at least two openings to expose a portion of the first doping region and the second doping region of the first patterned semiconductor layer. The second patterned semiconductor layer is disposed on the photosensitive region of the substrate and the first electrode is electrically connected to the first patterned semiconductor layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 21 illustrates a schematic view of a photoelectric device according to the eighth embodiment of the present invention.

DETAILED DESCRIPTION

The present invention specifically combines the advantage of using materials containing silicon to fabricate the thin film transistor, storage capacitor and photo sensor of a photo detector, in which the utilized silicon-contained material includes different crystal lattice structures. For instance, the semiconductor layer used for fabricating the thin film transistor and the photo sensor is composed of a silicon material having two different states. According to the preferred embodiment of the present invention, the semiconductor layer utilized in the thin film transistor is composed of a polysilicon material containing silicon, whereas the semiconductor layer utilized in the photo sensor is composed of an amorphous material containing silicon as an example, but not limited thereto. Since the amorphous material containing silicon has a much stronger sensitivity to ambient lights than other materials, the photo sensor of the present invention could achieve a much better photosensitivity than conventional photo sensors.

Figure 1:
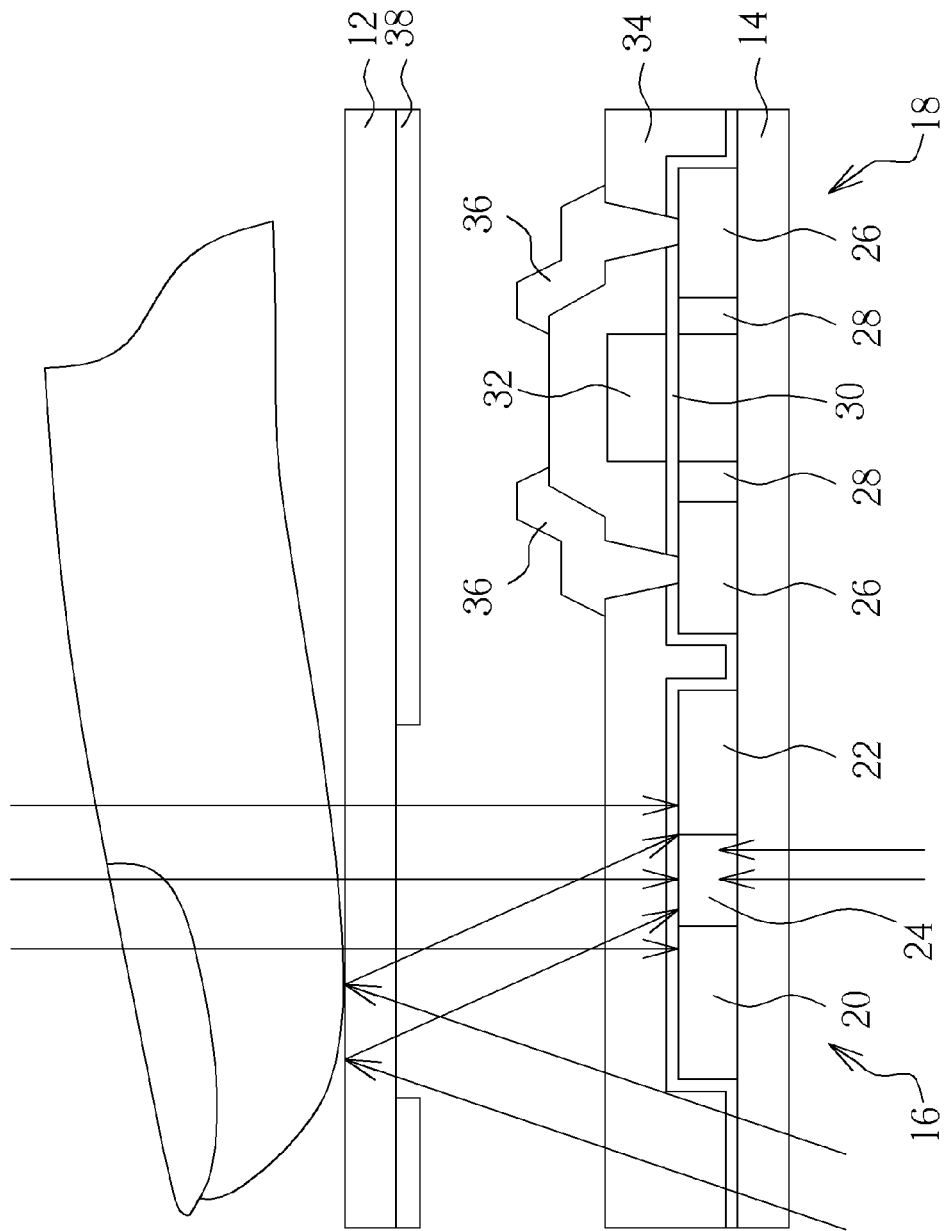
FIG. 1 illustrates a schematic view of a touch panel according to the traditional art.
Figure 2:
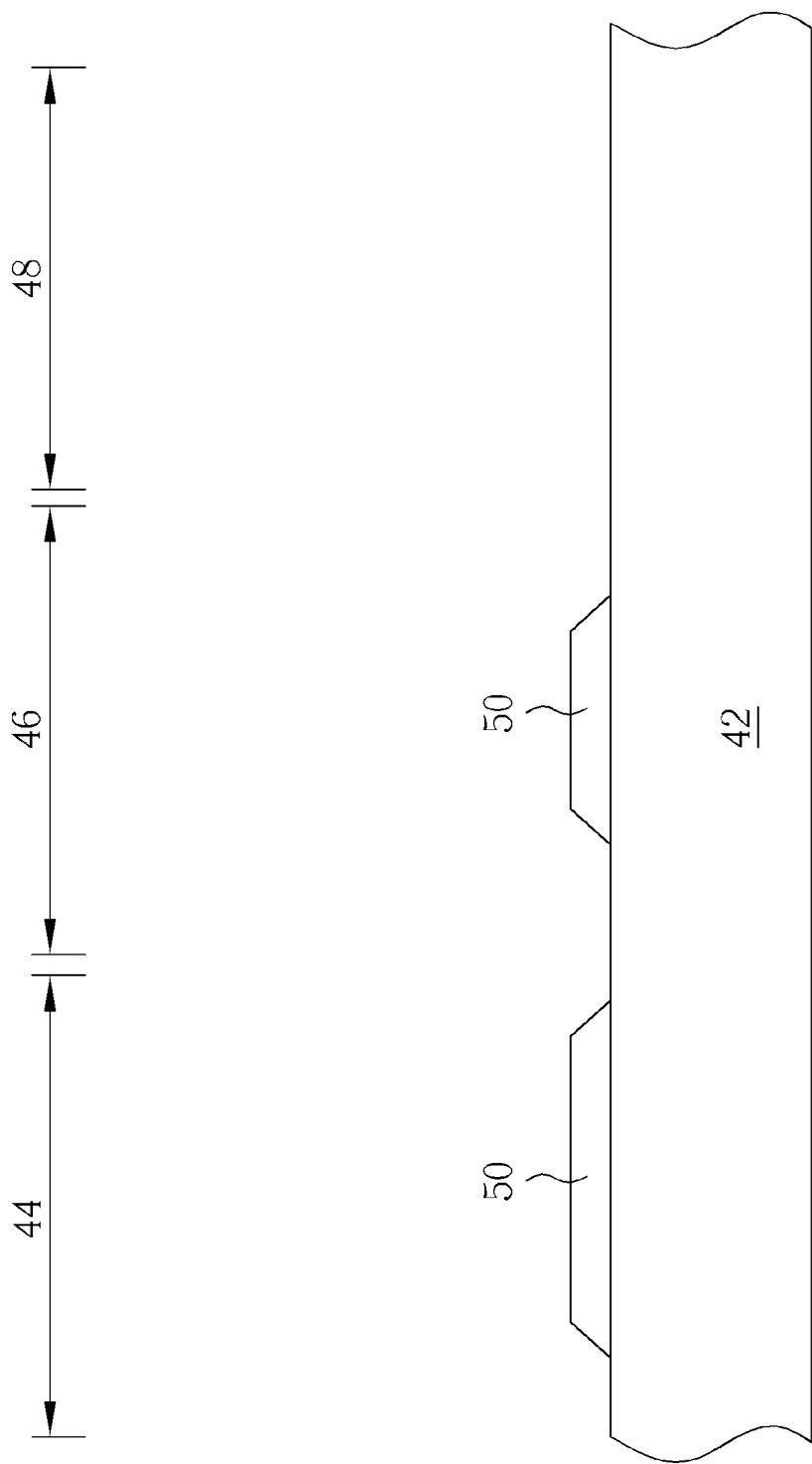
FIGS. 2-8 illustrate a method for fabricating a photo detector according to the first embodiment of the present invention.

Referring to FIGS. 2-8, FIGS. 2-8 illustrate a method for fabricating a photo detector according to the first embodiment of the present invention. As shown in FIG. 2, a substrate 42 having at least one transistor region 44, at least one capacitor region 46, and at least one photosensitive region 48 is first provided. However, the substrate 42 can also have at least one of the following regions: a signal line region (including scan line region and data line region), a contact pad region, a shorting bar region, a testing pad region, an integrated circuit connecting region or others. Additionally, the substrate 42 can be composed of transparent materials (such as glass, quartz, other transparent materials, others, or combinations thereof), non-transparent materials (such as ceramic, silicon piece, other non-transparent materials, others, or combinations thereof), or flexible materials (such as thinned glass, polyolefines, polyamides, polyalcohols, polyesters, rubber, thermoplastic polymers, thermocuring polymers, polyaromatics, polymethyl methacrylates, polycarbonates, other flexible materials, derivatives of aforementioned materials, or combinations thereof). The substrate of this embodiment of the present invention is composed of glass, but not limited thereto.

Next, a patterned semiconductor layer 50 (also referring to as the first patterned semiconductor layer) is formed on the transistor region 44 and the capacitor region 46 of the substrate 42. The semiconductor layer 50 is composed of single crystal material containing silicon, micro-crystalline material containing silicon, polycrystalline material containing silicon, amorphous material containing silicon, aforementioned silicon material containing germanium, aforementioned silicon material containing arsenic, other materials, or combinations thereof. This embodiment specifically utilizes polycrystalline material containing silicon, but not limited thereto. Additionally, the method for forming the semiconductor layer includes deposition/photolithography/etching, inkjet processes, screen printing processes, other processes, or combinations thereof.

Figure 3:
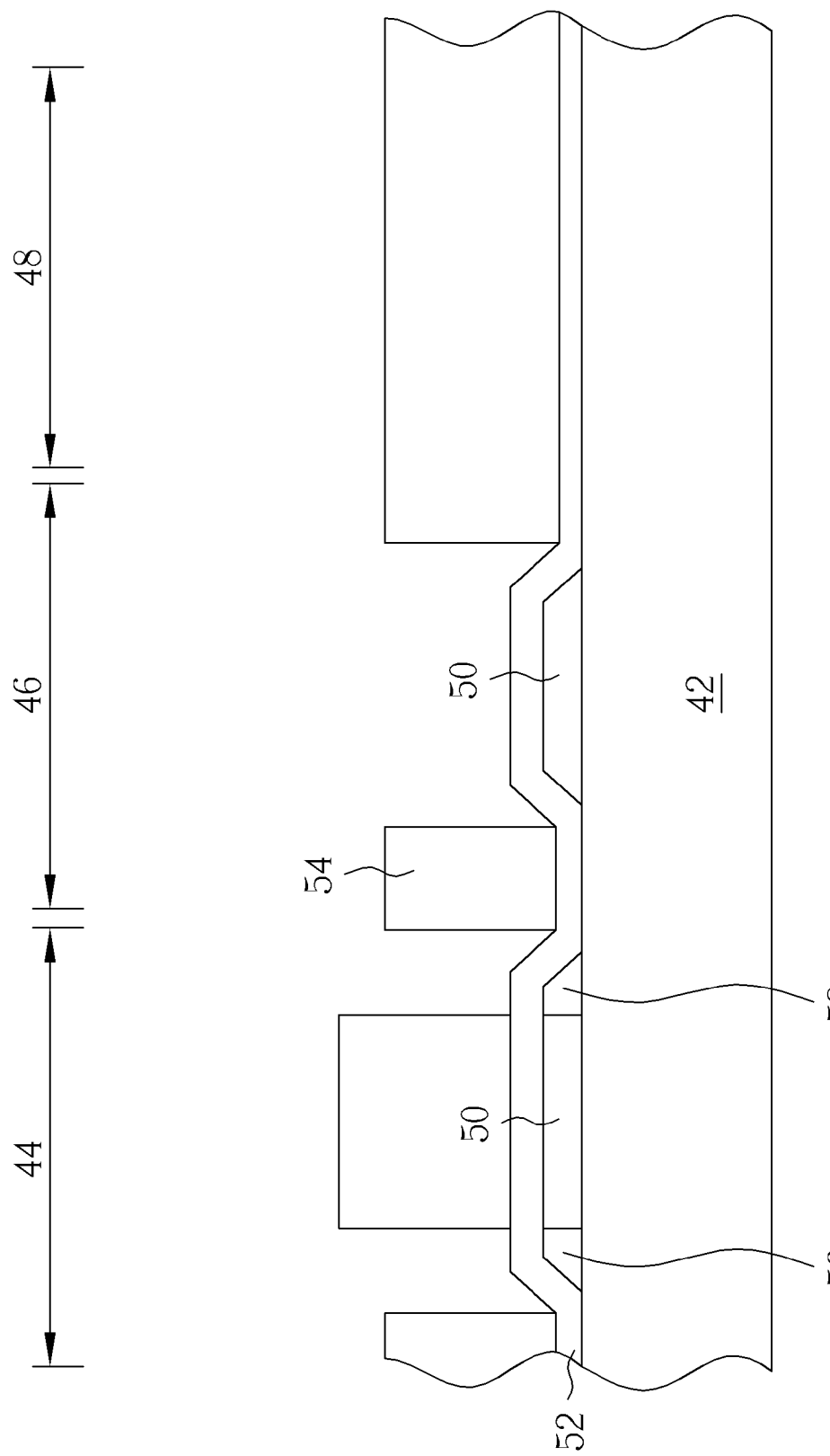

As shown in FIG. 3, at least a dielectric layer 52 is formed on the substrate 42 and the semiconductor layer 50, and a doping process is performed by using a patterned photoresist 54 as mask to form a first doping region 56 and a second doping region 58 in the semiconductor layer 50 of the transistor region 44 and a first electrode in the semiconductor layer 50 of the capacitor region 46. The dielectric layer 52 can have only one layer, two sub-layers, three sub-layers, and so on. The first doping region 56 and the second doping region 58 are serving as the source and drain regions of the thin film transistor formed afterwards. The first doping region 56 and the second doping region 58 can be formed simultaneously or one after another, and the polarity of the first doping region 56 can be substantially different from or substantially identical as the second doping region 58. Additionally, at least one of the first doping region 56 and the second doping region 58 is doped with n-type dopants, p-type dopants, or combinations thereof. For the present invention, the polarity of the first doping region 56 is substantially equal to the polarity of the second doping region 58 as an example, but not limited thereto.

Figure 4:
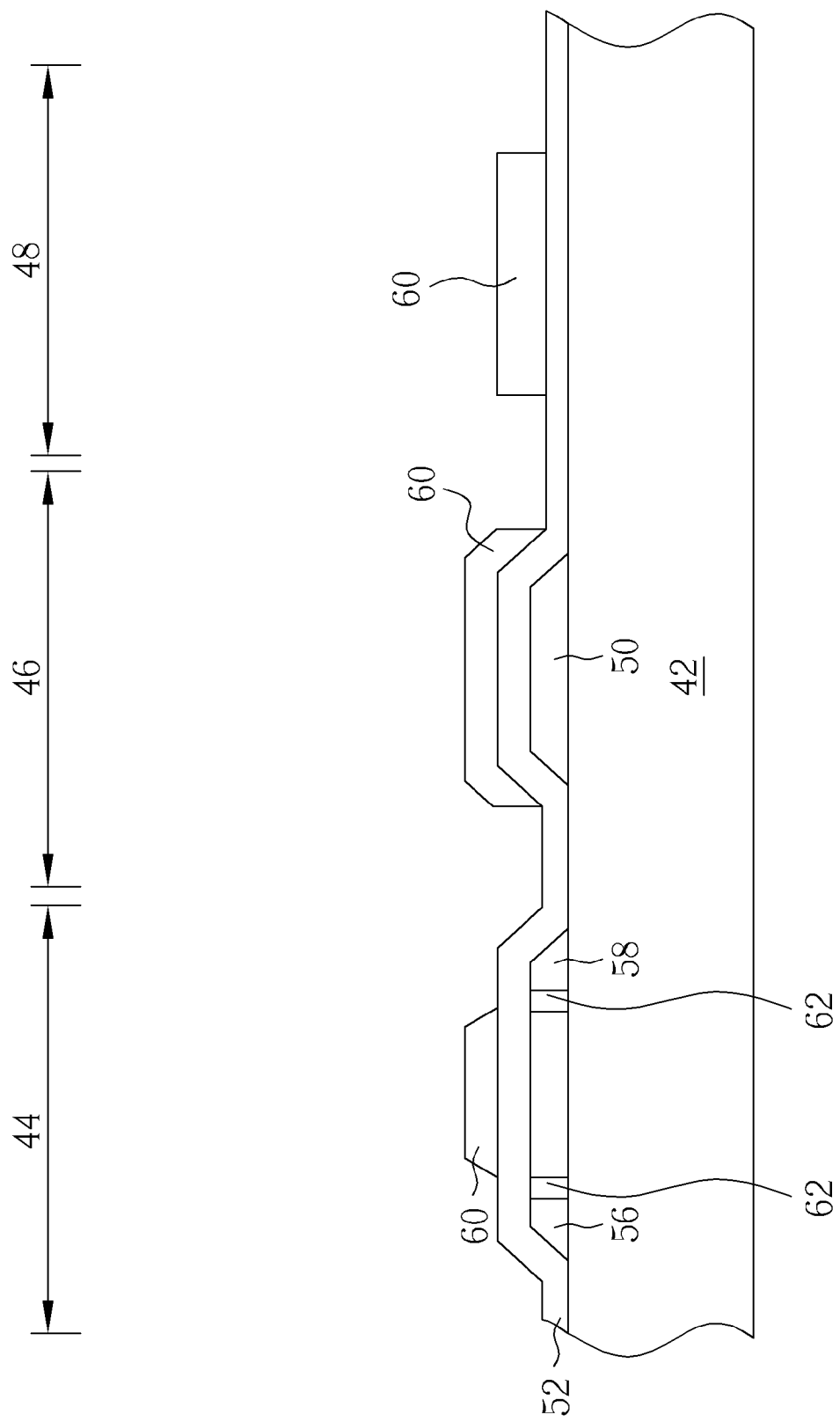

Next, as shown in FIG. 4, a patterned conductive layer 60 (also referring to as the first patterned conductive layer) is formed on the dielectric layer 52 of the transistor region 44, the capacitor region 46, and the photosensitive region 48, in which the patterned conductive layer 60 disposed on the transistor region 44 is a gate and the patterned conductive layer 60 disposed on the capacitor region 46 is a second electrode of the capacitor. The patterned conductive layer 60 disposed on the photosensitive region 48 is also referring to a gate. Another doping process is performed thereafter by using the patterned conductive layer 60 as mask to implant dopants into the semiconductor layer 50 of the transistor region 44 to form a lightly doped region 62 adjacent to at least one side adjacent to the first doping region 56 and the second doping region 58. The present embodiment preferably forms two lightly doped regions 62 adjacent to the first doping region 56 and the second doping region 58, respectively, but not limited thereto. The formation of the patterned conductive layer can be accomplished by using deposition processes/photolithography/etching processes, inkjet processes, screen printing processes, other processes, or combinations thereof.

It should be noted that the present invention conducts a doping process after the formation of the dielectric layer 52 and another doping process after the formation of the patterned conductive layer 60 to form the source and the drain regions and the lightly doped regions. However, the present invention could also conduct a doping process before the formation of the dielectric layer to form the source and the drain regions, conduct another doping process after the formation of the dielectric layer to form the lightly doped regions, or utilize the combination of aforementioned doping process to form the source and the drain regions and the lightly doped regions, which are all within the scope of the present invention. The source/drain regions and the lightly doped region of the present embodiment are formed at different times as an example. However, the source/drain regions and the lightly doped region can also be formed simultaneously after the patterned semiconductor layer is formed on the substrate, after the substrate is covered with the dielectric layer 52, or after the patterned conductive layer is formed on a portion of the dielectric layer.

Figure 5:
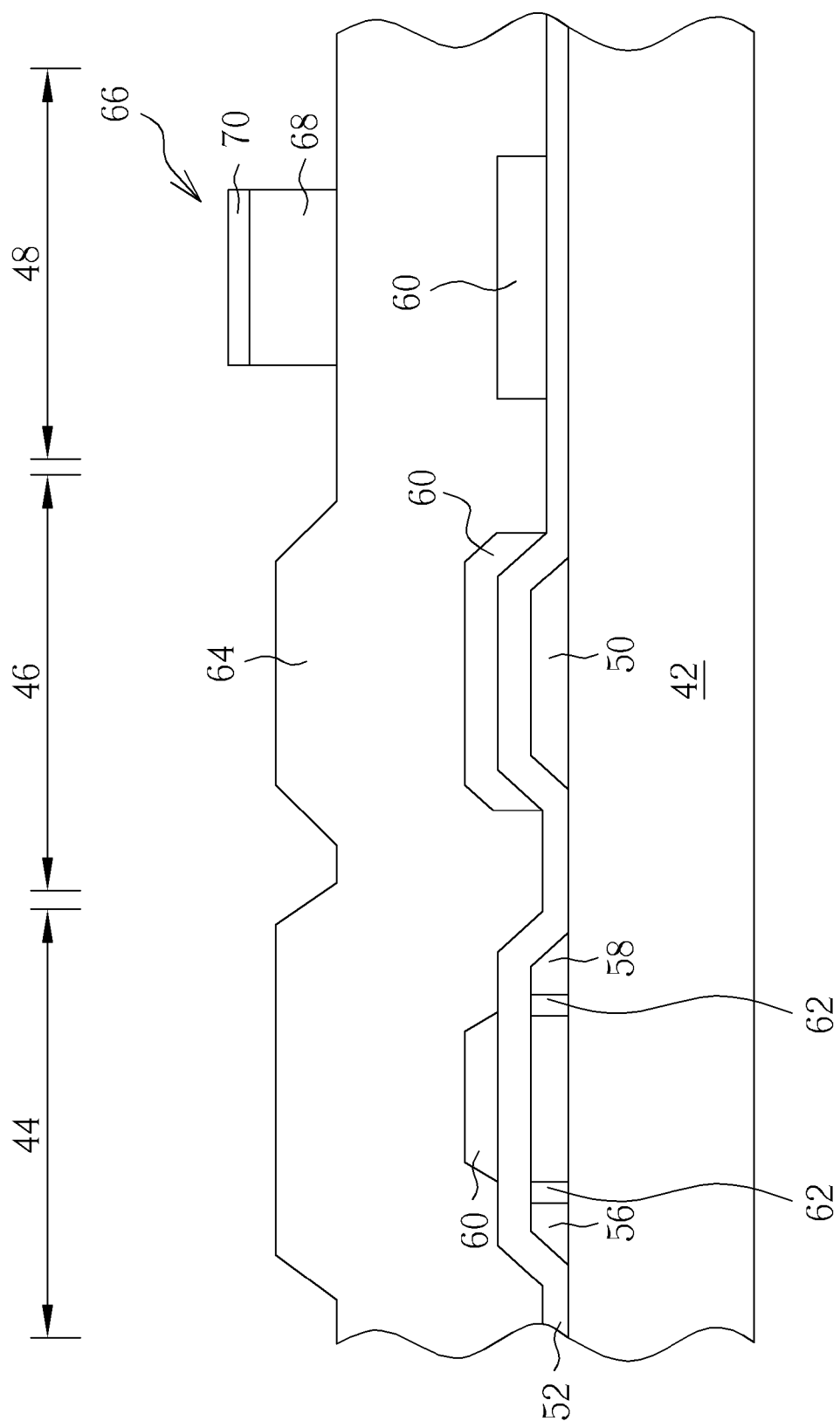

As shown in FIG. 5, an interlayer dielectric layer 64 is then formed to cover the dielectric layer 52 and the patterned conductive layer 60. The interlayer dielectric layer 64 can have only one layer, two sub-layers, three sub-layers, and so on. The interlayer dielectric layer 64 of the present embodiment includes only one layer, but not limited thereto. Additionally, the interlayer dielectric layer 64 can be composed of inorganic material, organic material, or a combination thereof.

Next, another patterned semiconductor layer 66 (also referring to as the second patterned semiconductor layer) is formed on the interlayer dielectric layer 64 of the photosensitive region 48. The semiconductor layer 66 is composed of single crystal material containing silicon, micro-crystalline material containing silicon, polycrystalline material containing silicon, amorphous material containing silicon, aforementioned silicon material containing germanium, other materials, or combinations thereof. This embodiment specifically utilizes amorphous material containing silicon, but not limited thereto. Additionally, the state of the semiconductor layer 66 is substantially different from the state of the semiconductor layer 50 disposed in the transistor region 44. For instance, while the semiconductor layer 50 is fabricated with a polycrystalline material containing silicon, the semiconductor layer 66 is fabricated with an amorphous material containing silicon as an example, but not limited thereto. The semiconductor layer 66 can have only one layer, two sub-layers, or three sub-layers. The semiconductor layer 66 of the present embodiment is preferably composed of two sub-layers 68 and 70 as an example, in which the two sub-layers 68 and 70 can be vertically arranged or horizontally arranged. In the present embodiment, the sub-layers 68 and 70 are vertically arranged as an example. If the semiconductor layer 66 is composed of two sub-layers 68 and 70, one of the two sub-layers could be composed of a doped semiconductor layer whereas the other sub-layer could be composed of an undoped semiconductor layer and/or at least one other doped semiconductor layer. If two sub-layers are composed of doped semiconductor material and another doped semiconductor layer, the doping concentration of one of the sub-layers would be substantially less than or substantially equal to the doping concentration of the other sub-layer. The dopants implanted into the semiconductor layer could contain n-type dopants, p-type dopants, or combinations thereof.

Figure 6:
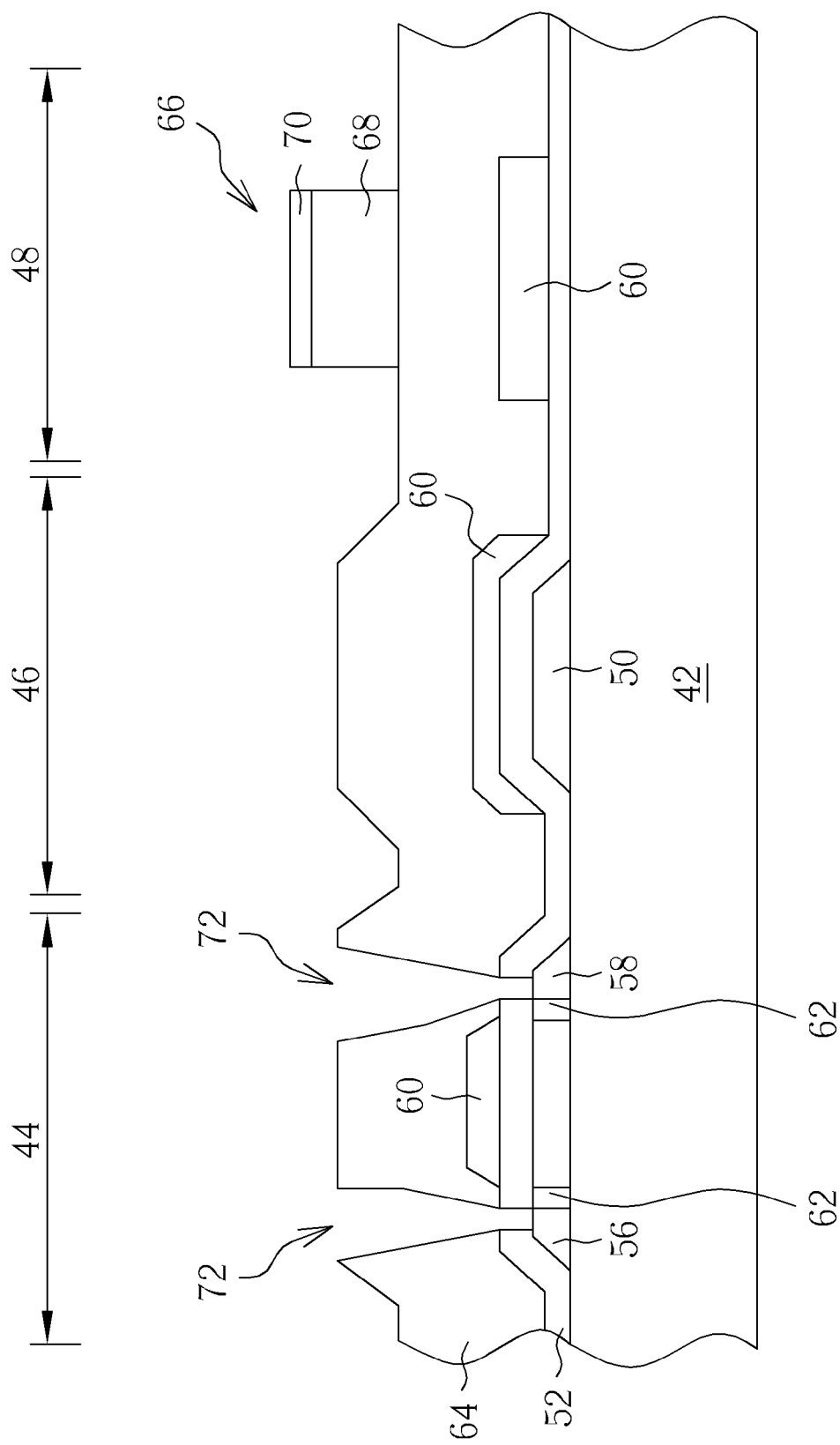

After the formation of the patterned semiconductor layer 66, at least one of an activation process and a gas treatment is conducted to repair possible defect of the semiconductor layer 66. However, the activation process and the gas treatment could also be omitted according to the design of the product, which is also within the scope of the present invention. The formation of the semiconductor layer 66 can be accomplished by using deposition processes/photolithography/etching processes, inkjet processes, screen printing processes, other processes, or combinations thereof. Next, another patterning process is performed by using a patterned photoresist (not shown) as mask to conduct an etching process. The etching process preferably forms at least two openings 72 in the interlayer dielectric layer 64 of the transistor region 44, as shown in FIG. 6, in which each of the openings 72 exposes at least one portion of the first doping region 56 and the second doping region 58. Alternatively, the order of the above fabrication process can be adjusted according to the design of the product. For instance, the present invention could also perform one of the aforementioned activation process and gas treatment as soon as the interlayer dielectric layer 64 is deposited and form the semiconductor layer 66 thereafter, not conducting either of the activation process and the gas treatment after the formation of the interlayer dielectric layer 64, or conducting either one of the activation or gas treatment after the deposition of the interlayer dielectric layer 64 and conducting the other of the activation or gas treatment after the formation of the semiconductor layer 66, which are all within the scope of the present invention. Preferably, the gas utilized in the gas treatment contains at least one of the following element: hydrogen, helium, neon, argon, krypton, xenon, radon, gas containing fluorine (such as: carbon tetrafluoride, fluoroform, sulfur hexafluoride, hydrogen fluoride, nitrogen difluoride, nitrogen trifluoride, fluoroethane, silicon tetrafluoride, fluoropropane, fluorochloromethane, fluorochloroethane, fluorochloropropane, other gases, or combinations thereof), gas containing oxygen (such as: oxygen gas, ozone, nitric oxide, nitrogen dioxide, other gases, or combinations thereof), gas containing chlorine (such as: chlorine gas, hydrogen chloride, chloroform, silicon tetrachloride, nitrogen dichloride, nitrogen trichloride, chloroethane, chloropropane, fluorochloromethane, fluorochloroethane, fluorochloropropane, boron chloride, other gases, or combinations thereof), gas containing nitrogen (such as: nitrogen gas, nitric oxide, nitrogen dioxide, other gases, or combinations thereof), or other gases. The apparatus utilized in incorporation with the aforementioned gases includes plasma apparatus, heating apparatus, microwave apparatus, others apparatuses, or any two combinations thereof.

Preferably, at least one of the dielectric layer 52 and the interlayer dielectric layer 64 is comprised of inorganic materials (such as silicon dioxide derived from silane, silicon dioxide derived from tetraethoxysilane, oxynitride, similar material, or combinations thereof), organic material (such as photoresist, polyarylene ether (PAE), polyolefines, polyamides, polyalcohols, polyesters, benzocyclobutene (BCB), hydrogen silsesquioxane (HSQ), methyl silesquioxane (MSQ), silicon-oxygen-carbon-hydrogen compounds (SiOC—H), other materials, or combinations thereof), or combinations thereof. The conductive layer 60 is comprised of transparent materials (such as indium tin oxides (ITO), aluminum zinc oxides (AZO), aluminum tin oxides (ATO), indium zinc oxides (IZO), cadmium tin oxides (CTO), other materials, or combinations thereof), reflective materials (such as gold, silver, copper, iron, tin, lead, cadmium, molybdenum, tungsten, neodymium, titanium, tantalum, hafnium, other materials, oxides thereof, nitrides thereof, oxynitrides thereof, alloys thereof, or combinations thereof), or combinations thereof. The dielectric layer 52 is comprised of silicon oxides derived from tetraethoxysilane having a thickness of about 100 angstroms and the conductive layer 60 is comprised of molybdenum as an exemplification of the present invention, but not limited thereto.

Figure 7:
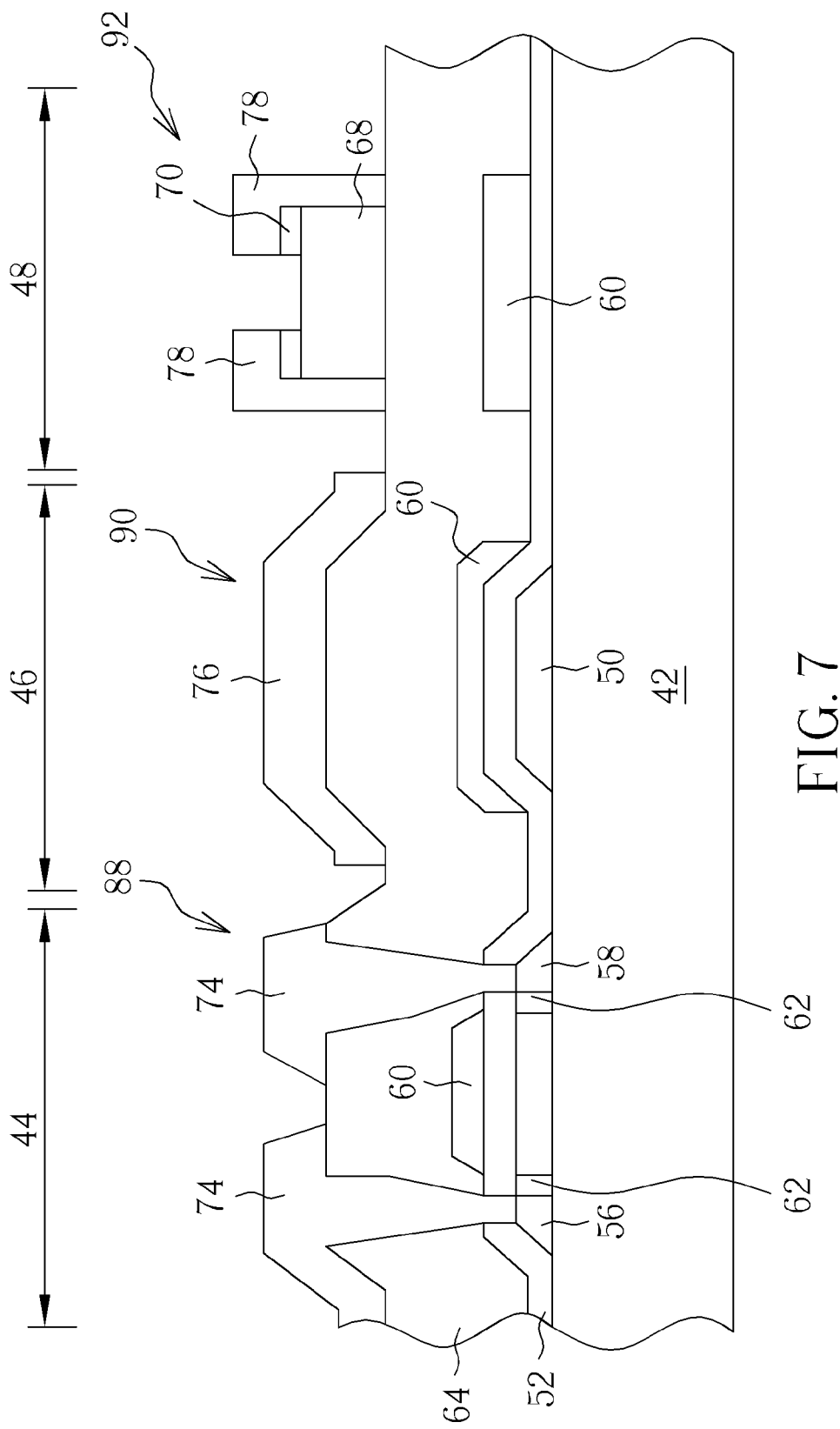

As shown in FIG. 7, a metal layer (not shown) is formed on the interlayer dielectric layer 64, and a patterning process is conducted to remove a portion of the metal layer to form two electrodes 74 (also refers to as a source and a drain electrodes) on the interlayer dielectric layer 64 of the transistor region 44, one capacitor electrode 76 (also refers to as the third electrode of the capacitor) on the interlayer dielectric layer 64 of the capacitor region 46, and two electrodes 78 (also refers to as a source and a drain electrodes) on a portion of the patterned semiconductor layer 66 of the photosensitive region 48. This completes the fabrication of a transistor 88 in the transistor region 44, a storage capacitor 90 in the capacitor region 46, and a photo sensor 92 in the photosensitive region 48. The storage capacitor 90 is composed of a first capacitor having a first electrode (such as the patterned semiconductor layer 50 disposed on the capacitor region 46), the dielectric layer 52, and a second electrode (such as the patterned conductive layer 60 disposed on the capacitor region 46), and a second capacitor having the second electrode (such as the patterned conductive layer 60 disposed on the capacitor region 46), the interlayer dielectric layer 64, and the a third electrode 76. However, the storage capacitor 90 can also be composed of either one of the first capacitor and the second capacitor. It should be noted that the thin film transistor 88 is a transistor having top gate structure. The present invention could also utilize a thin film transistor having bottom gate structure according to the design of the product, which is also within the scope of the invention. Additionally, the photo sensor 92 is fabricated similar to a bottom gate design, but not limited thereto. The photo sensor 92 could also be fabricated according to a top gate structure, a diode structure, or other structures. Moreover, the formation of the two electrodes 74, the third electrode 76 of the capacitor, and the two electrodes 78 can be accomplished by using deposition processes/photolithography/etching processes, inkjet processes, screen printing processes, other processes, or combinations thereof.

Figure 8:
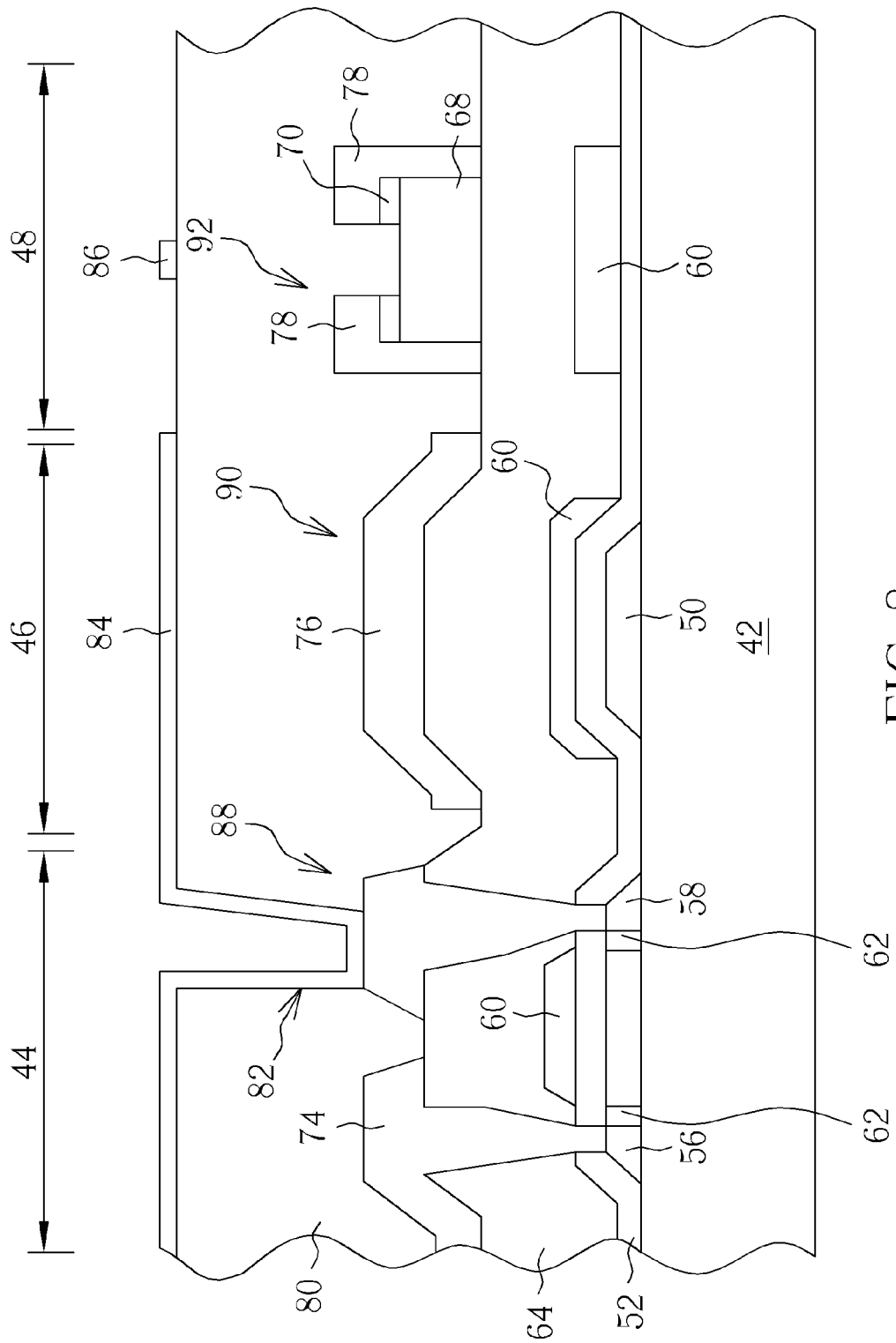

As shown in FIG. 8, a patterned passivation layer 80 is formed to cover the electrodes 74 of the transistor region 44, the third electrode 76 of the capacitor of the capacitor region 46, the semiconductor layer 66 of the photosensitive region 48 and the electrodes 78 of the photosensitive region 48, and an opening 82 is formed in the passivation layer 80 to expose one of the electrodes 74. Another patterned conductive layer (also refers to as the second patterned conductive layer) is then formed on the portion of the passivation layer 80. This patterned conductive layer preferably has a first portion 84 and a second portion 86 formed on the passivation layer 80 of the transistor region 44 and the photosensitive region 48, respectively. Additionally, the first portion 84 of the patterned conductive layer is electrically connected to one of the electrodes 74, and the second portion 86 of the patterned conductive layer is disposed on the passivation layer 80 between the two electrodes 78 of the photosensitive region 78. At least one of the formation of the patterned passivation layer 80 and the other patterned conductive layer can be accomplished by using deposition processes/photolithography/etching processes, inkjet processes, screen printing processes, other processes, or combinations thereof.

Preferably, the passivation layer 80 is comprised of inorganic materials (such as silicon dioxide derived from silane, silicon dioxide derived from tetraethoxysilane, oxynitride, similar material, or combinations thereof), organic material (such as photoresist, polyarylene ether (PAE), polyolefines, polyamides, polyalcohols, polyesters, benzocyclobutene (BCB), hydrogen silsesquioxane (HSQ), methyl silesquioxane (MSQ), silicon-oxygen-carbon-hydrogen compounds (SiOC—H), other materials, or combinations thereof), or combinations thereof. The other patterned conductive layer is comprised of transparent materials (such as indium tin oxides, aluminum zinc oxides, aluminum tin oxides, indium zinc oxides, cadmium tin oxides, other materials, or combinations thereof), reflective materials (such as gold, silver, copper, iron, tin, lead, cadmium, molybdenum, tungsten, neodymium, titanium, tantalum, hafnium, other materials, oxides thereof, nitrides thereof, oxynitrides thereof, alloys thereof, or combinations thereof), or combinations thereof. The patterned conductive layer of the present embodiment is composed of transparent material such as indium tin oxides as an example, but not limited thereto. It should be noted that the first portion 84 of the patterned conductive layer of the transistor region 44 is also referred to as the pixel electrode, whereas the second portion 86 of the patterned conductive layer of the photosensitive region 48 is referred to as the second gate electrode. Since another patterned conductive layer is disposed in the capacitor region 46, the storage capacitor 90 eventually includes an additional capacitor (also referred to as a third capacitor, not remarked in the figure), in which the additional capacitor is composed of the first portion 84 of the patterned conductive layer, the passivation layer 80, and the third electrode 76. In other words, the storage capacitor 90 includes at least one of the first capacitor, the second capacitor, and the third capacitor.

Figure 9:
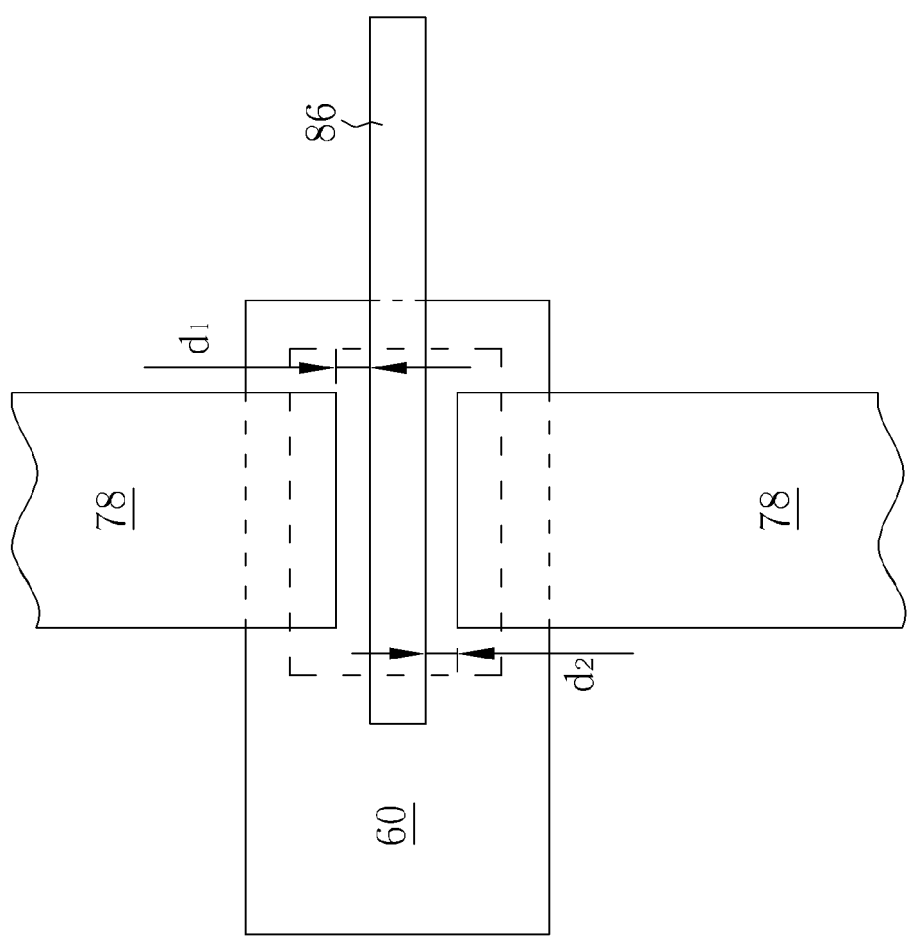
FIG. 9 illustrates a top view of the photo sensor of the photo detector shown in FIG. 8.

Referring to FIG. 9, FIG. 9 illustrates a top view of the photo sensor 92 of the photo detector shown in FIG. 8. As shown in FIGS. 8-9, the second portion 86 of the patterned conductive layer is disposed according to a floating manner on the passivation layer 80 with respect to the substantially middle section between the two electrodes 78. However, the second portion 86 can also be disposed substantially close to either one of the two electrodes 78 or the sides of the second portion 86 being aligned to either one of the electrodes 78. For instance, the second portion 86 of the patterned conductive layer and the two electrodes 78 have a first distance d1 (also referred to as first gap) and a second distance d2 (also referred to as first gap) therebetween. According to the preferred embodiment of the present invention, the first distance d1 is between about 2 microns to about 15 microns, and the second distance d2 is between about 0 microns to about 15 microns. The ratio between the first distance d1 and the second distance d2 is about 0 to about 7.5, but not limited thereto. The gap and the ratio between the two distances can be adjusted according to the demand of the product. Moreover, depending on different applications, the second portion 86 of the patterned conductive layer can also be connected to other devices, which is also within the scope of the present invention.

In addition to the connecting method disclosed in the first embodiment, the second portion 86 of the patterned conductive layer can also be connected to other devices, such as a voltage source. The voltage source could be a specific voltage source, a ground voltage source, or other voltage sources. Preferably, methods for connecting the second portion of the patterned conductive layer are listed in the embodiments below.

Figure 10:
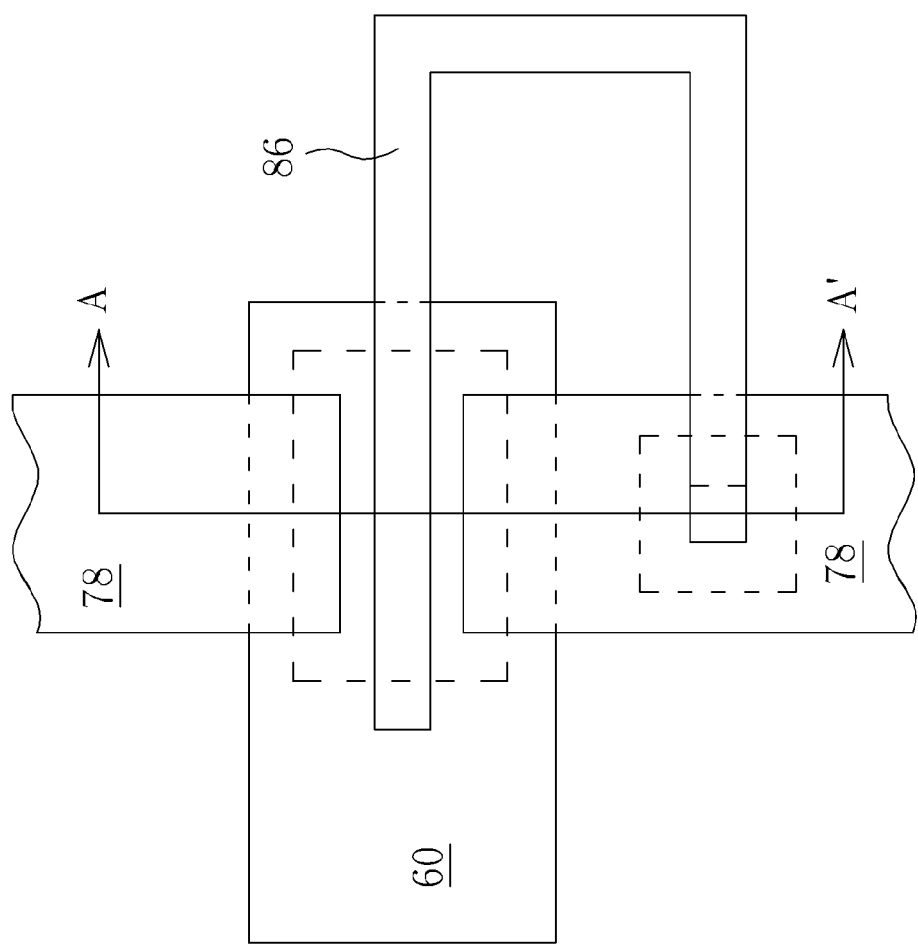
FIG. 10 illustrates a top view of electrically connecting the second portion of the patterned conductive layer of the photo sensor according to the second embodiment of the present invention.
Figure 11:
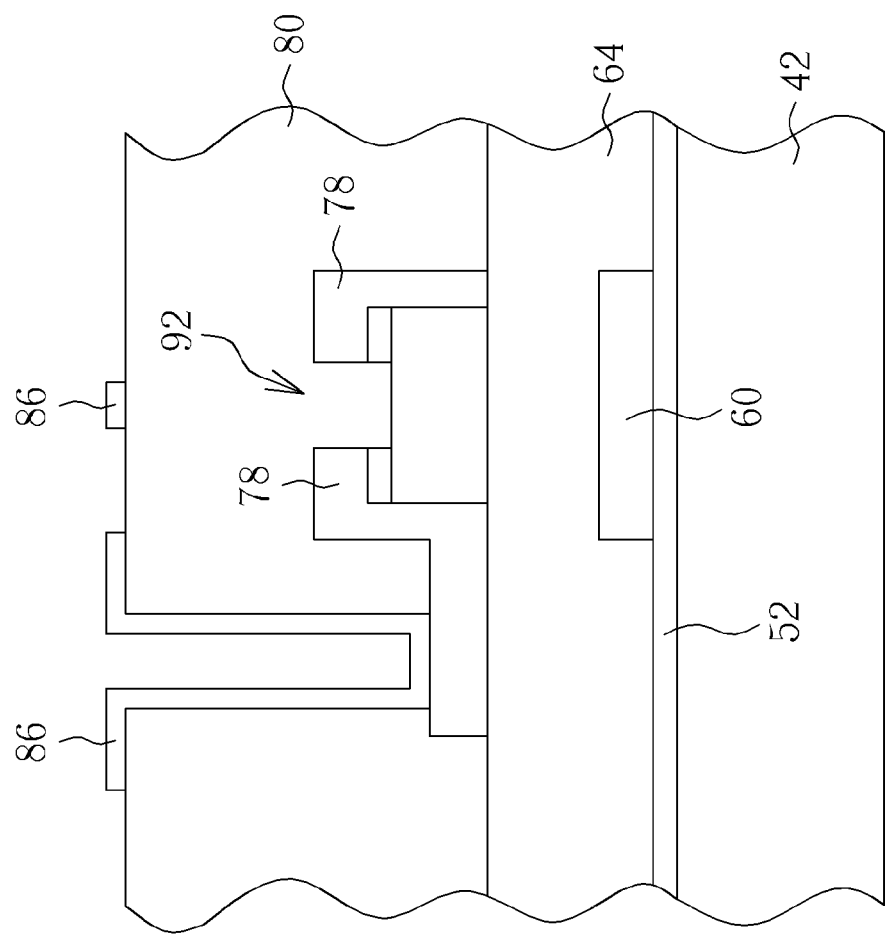
FIG. 11 illustrates a cross-sectional view of FIG. 10 along the sectional line AA'.

Referring to FIGS. 10-11, FIG. 10 illustrates a top view of electrically connecting the second portion 86 of the patterned conductive layer of the photo sensor 92 according to the second embodiment of the present invention, and FIG. 11 illustrates a cross-sectional view of FIG. 10 along the sectional line AA'. As shown in the figures, one end of the second portion 86 of the patterned conductive layer is disposed in a floating manner substantially closed to the middle between the two electrodes 78, whereas the other end of second portion 86 is extended and electrically connected to one of the two electrodes 78 of the photo sensor 92. In addition to be placed relative to the substantially middle section between the two electrodes 78, the second portion 86 of the patterned conductive layer could also be positioned according to the design disclosed in the aforementioned embodiments.

Figure 12:
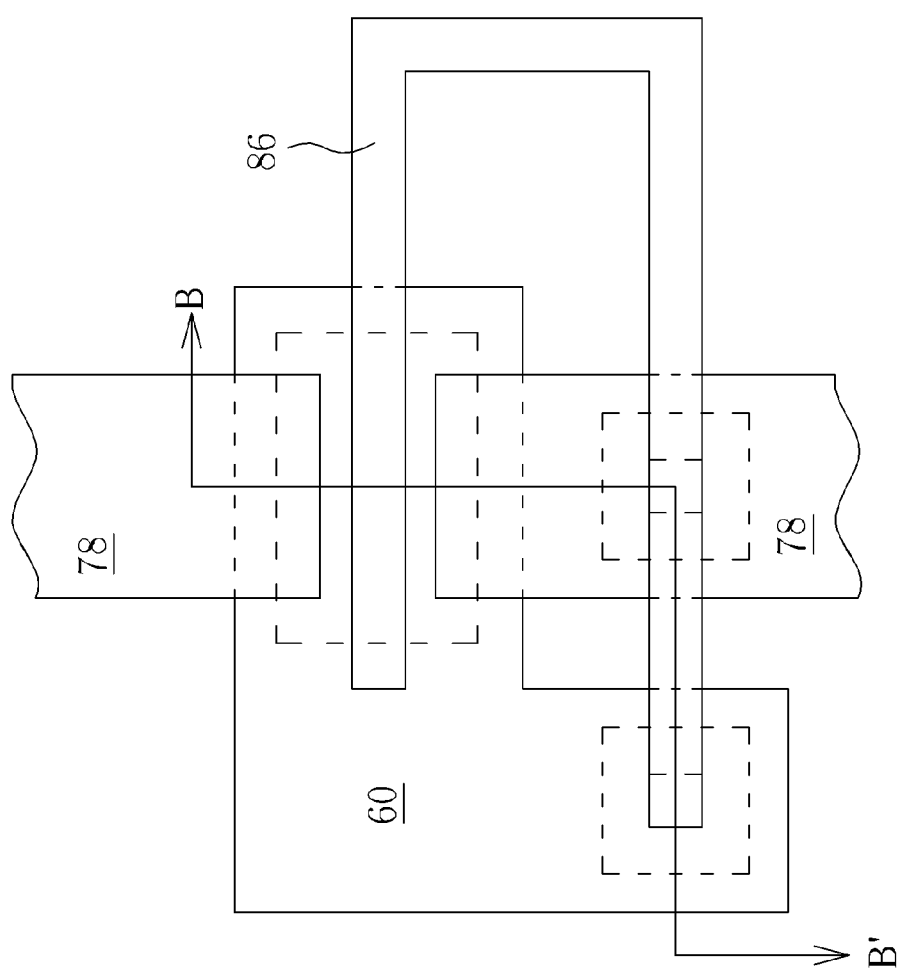
FIG. 12 illustrates a top view of electrically connecting the second portion of the patterned conductive layer of the photo sensor according to the third embodiment of the present invention.
Figure 13:
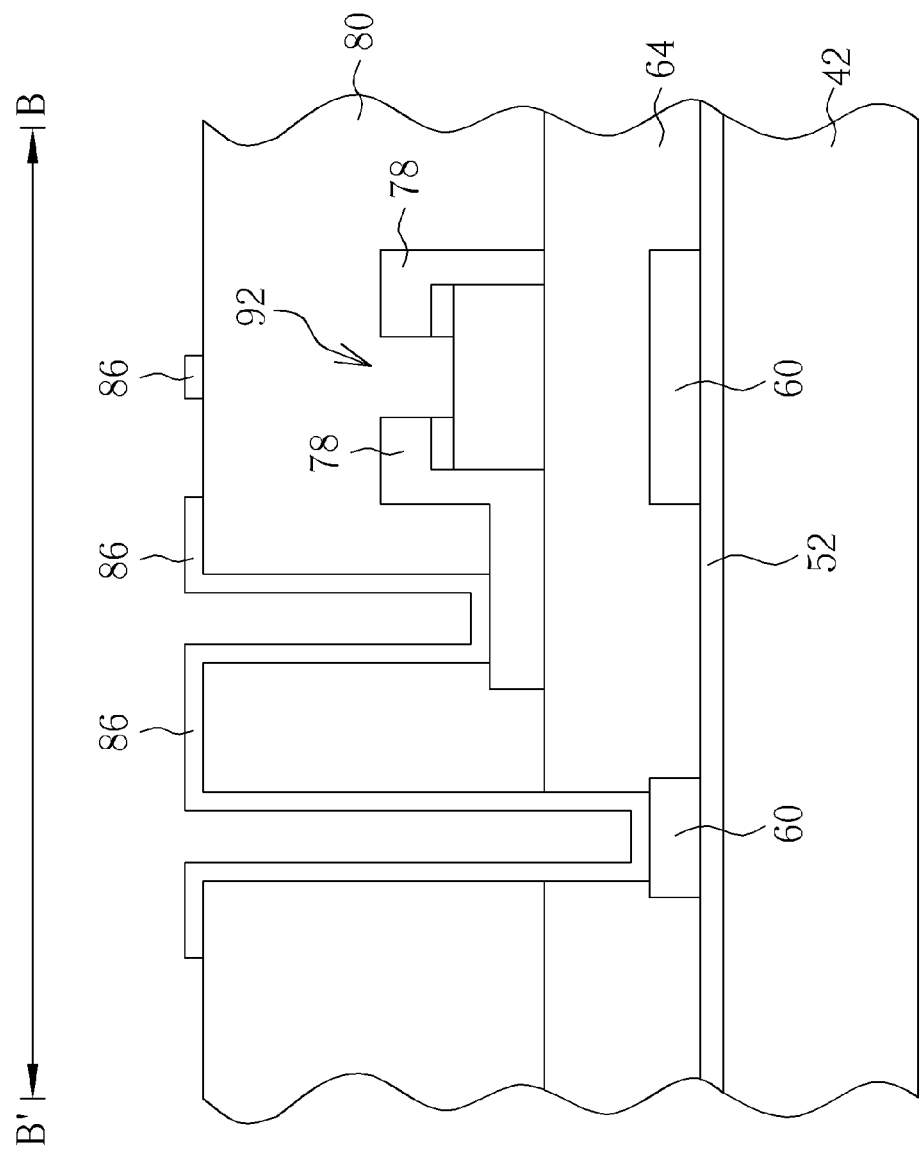
FIG. 13 illustrates a cross-sectional view of FIG. 12 along the sectional line BB'.

Referring to FIGS. 12-13, FIG. 12 illustrates a top view of electrically connecting the second portion 86 of the patterned conductive layer of the photo sensor 92 according to the third embodiment of the present invention, and FIG. 13 illustrates a cross-sectional view of FIG. 12 along the sectional line BB'. Similar to the second embodiment, one end of the second portion 86 of the patterned conductive layer is disposed in a floating manner substantially close to the middle between two electrodes 78, whereas the other end of the second portion 86 is extended and electrically connected to one of the two electrodes 78 of the photo sensor 92. In addition to be placed relative to the substantially middle section between the two electrodes 78, the second portion 86 of the patterned conductive layer could also be positioned according to the design disclosed in the aforementioned embodiments. Moreover, the patterned conductive layer 60 disposed on the dielectric layer 52 is further extended to a position adjacent to one of the electrodes 78, such that one end of the second portion 86 not only connects one of the two electrodes 78 but also electrically connects the patterned conductive layer 60 adjacent to the electrode 78.

Figure 14:
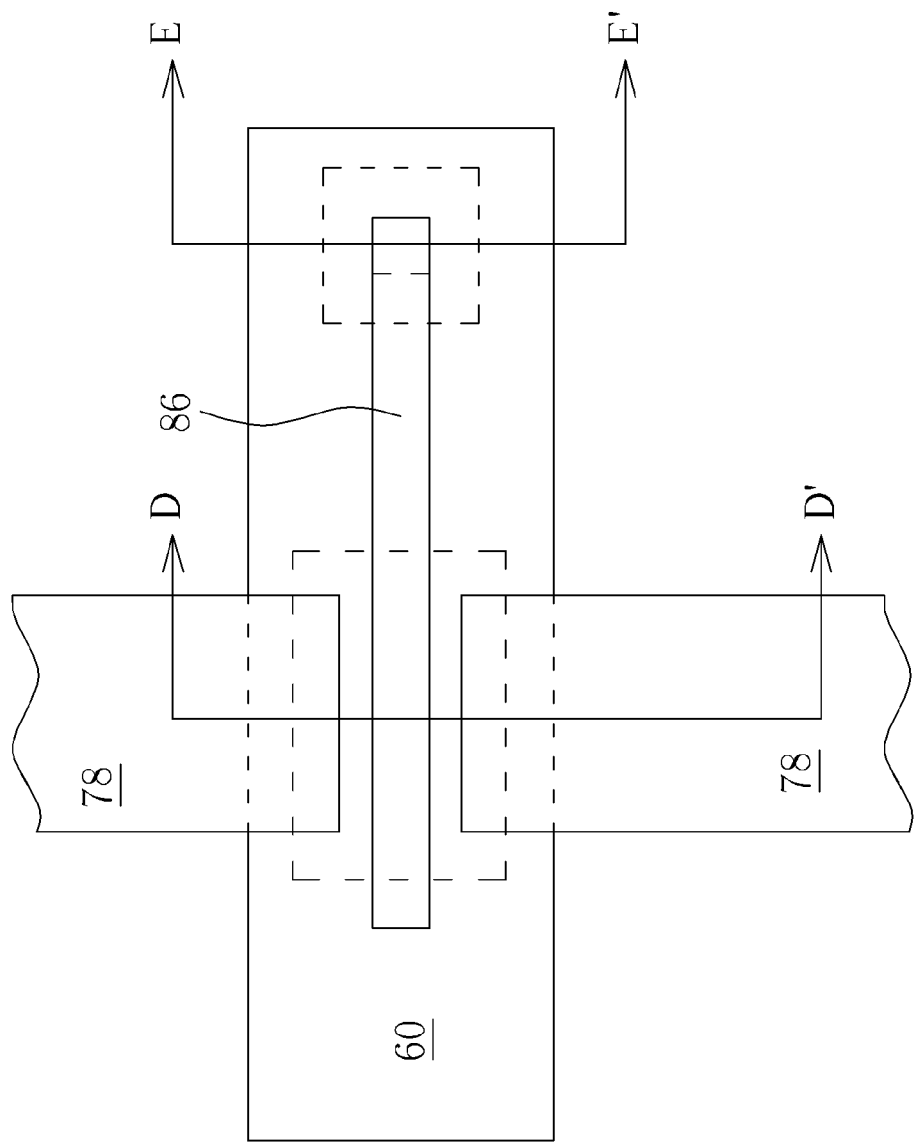
FIG. 14 illustrates a top view of electrically connecting the second portion of the patterned conductive layer of the photo sensor according to the fourth embodiment of the present invention.
Figure 15:
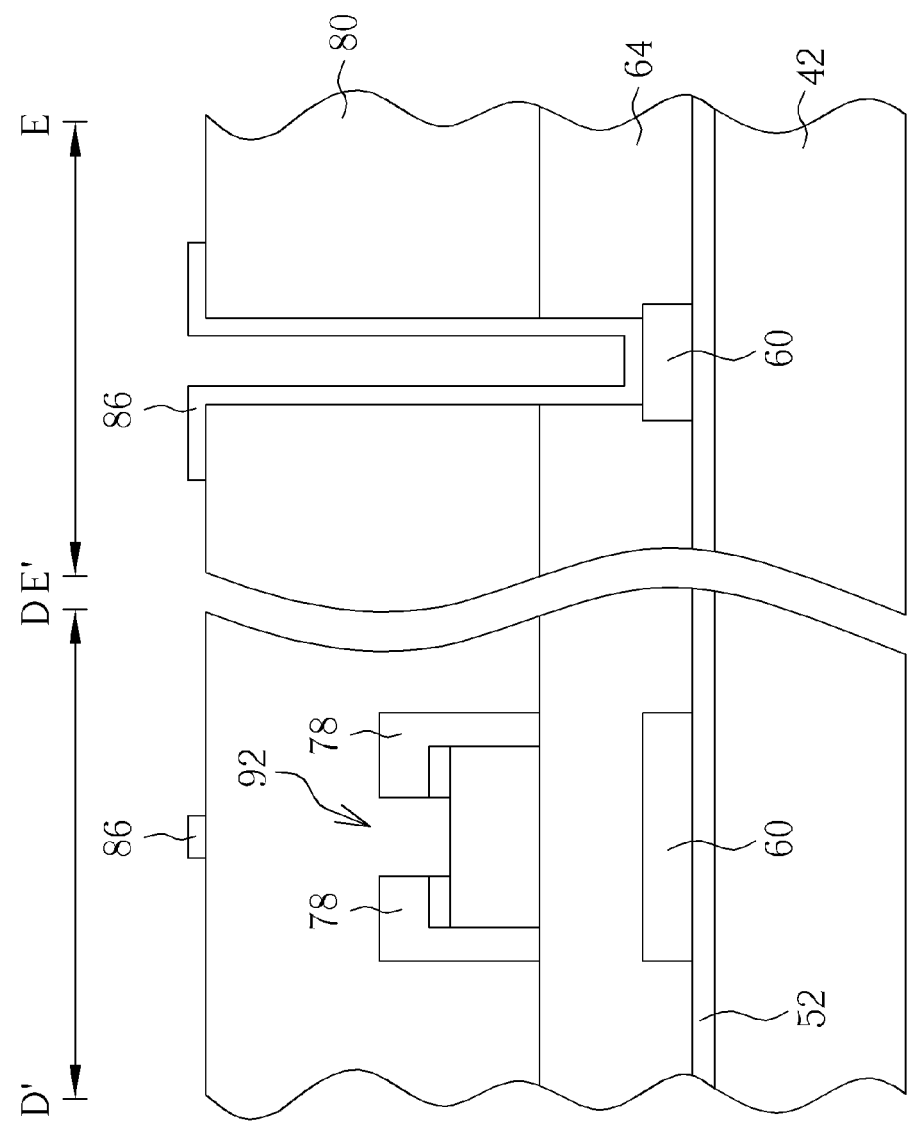
FIG. 15 illustrates a cross-sectional view of FIG. 14 along the sectional line DD' and EE'.

Referring to FIGS. 14-15, FIG. 14 illustrates a top view of electrically connecting the second portion 86 of the patterned conductive layer of the photo sensor 92 according to the fourth embodiment of the present invention, and FIG. 15 illustrates a cross-sectional view of FIG. 14 along the sectional lines DD' and EE'. As shown in figures, the present embodiment specifically extends the patterned conductive layer 60 and the second portion 86 of another patterned conductive layer, such that one end of the second portion 86 is disposed in a floating manner substantially close to the middle between the two electrodes 78, whereas the other end is electrically connected to the extended patterned conductive layer 60. In addition to be placed relative to the substantially middle section between the two electrodes 78, the second portion 86 of the patterned conductive layer could also be positioned according to the design disclosed in the aforementioned embodiments.

It should be noted that the photo detector disclosed in the aforementioned embodiments could be fabricated with or without a typical TFT-LCD fabrication process. Moreover, the structure and fabrication process of the photo detector of the present invention could also be applied to other processes, such as to the ones for fabricating flat panel displays or semiconductor processes. The position of the photo detector could be adjusted according to the design of the product.

Figure 16:
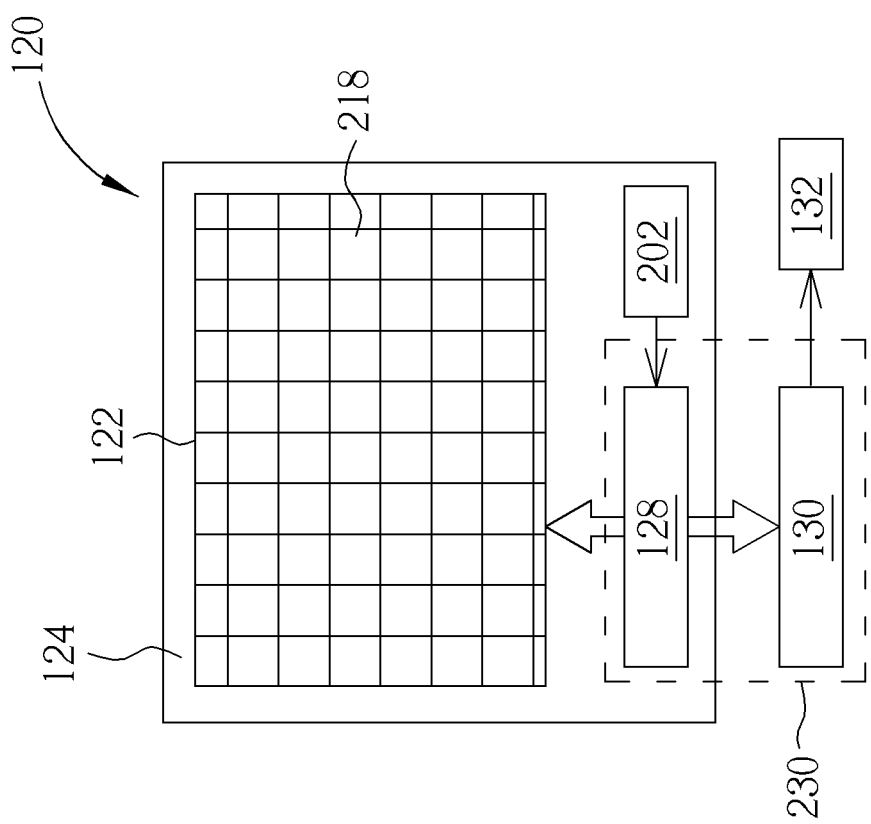
FIGS. 16-17 illustrate a view of applying a photo detector onto a display panel according to the fifth and sixth embodiment of the present invention.
Figure 17:
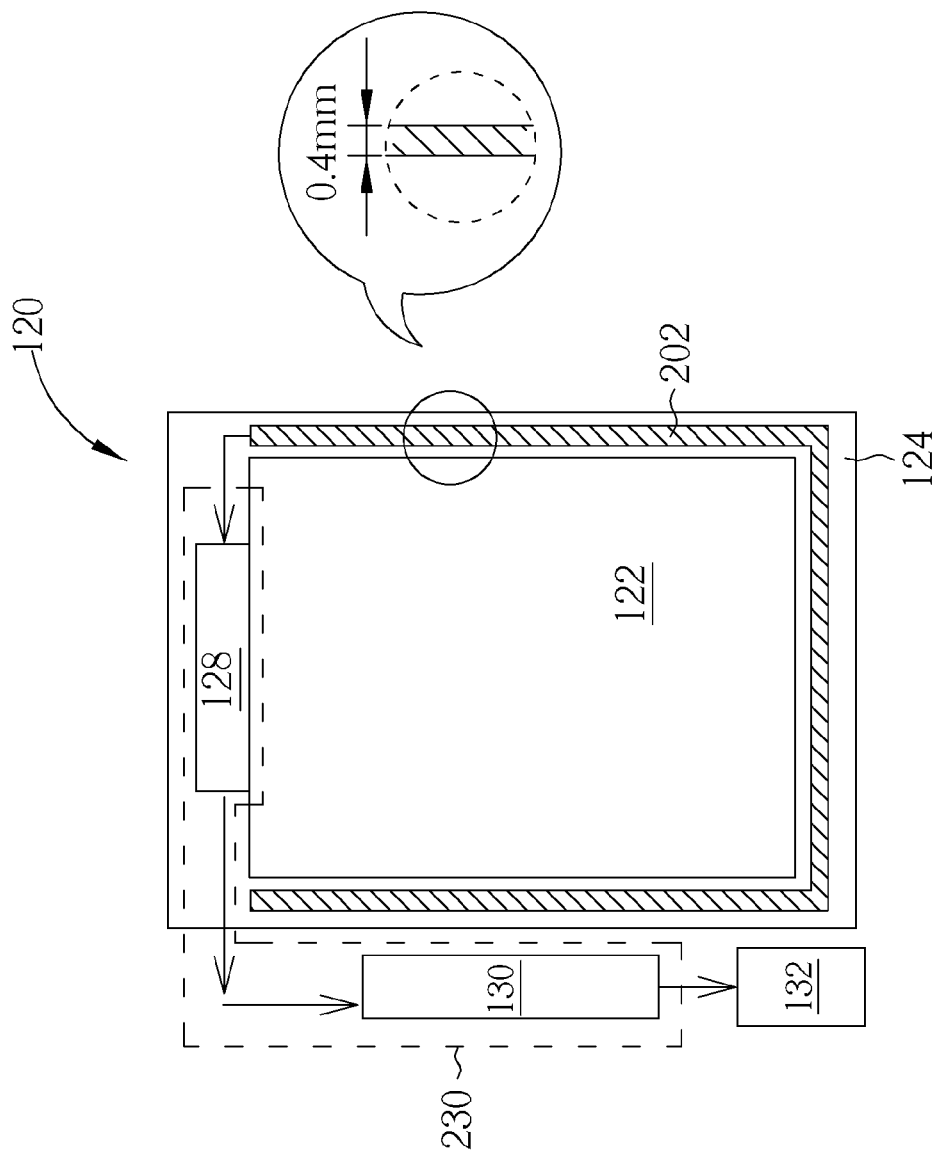

Referring to FIGS. 16-17, FIGS. 16-17 illustrate a view of applying a photo detector onto a display panel according to the fifth and sixth embodiment of the present invention. Preferably, the photo detector of the present invention can be applied to either one or both the display area and non-display area of the display panel 120. Referring to FIG. 16, FIG. 16 illustrates a view of disposing a photo detector on the non-display area of a display panel 120. As shown in FIG. 16, the display panel of the present invention has a display area 122 and a non-display area 124, a plurality of pixels 218 disposed within the display area 122 and adapted to show the image and color of the display panel, and at least one photosensitive region 202 disposed in the non-display area 124. In the present embodiment, the photosensitive region 202 (which can be more than one) is positioned adjacent to at least one corner of the display panel 120, but no limited thereto. In other words, the photosensitive region 202 can be positioned in at least one corner of the non-display area 124, substantially near the middle of the display and within the non-display area 124, substantially near the corner of the display and within the non-display area 124, other location within the non-display area 124, or combinations thereof. The photosensitive region 202 having at least one of the aforementioned embodiments of the photo detector (not shown) of the present invention is electrically connected to at least one driving circuit 230, and at least one driving circuit 230 is electrically connected to the pixels 218. Preferably, the photosensitive region 202 can be utilized as an ambient light sensing region, in which the lights may include at least one of the visible lights and invisible lights (such as ultraviolet lights, infrared lights, or lights of other wavelengths). Hence, the signal transmitted by the photo detector within the photosensitive region 202 could assist the display panel to achieve a much better image. The driving circuit 230 could also include a signal driving circuit 128, a light source driving circuit 130, a power supply circuit, a signal processing circuit, circuits of other functions, or any two combinations thereof. The display panel 120 also has a light source 132, which may be a point light source (such as an inorganic light emitting diode, an organic light emitting diode, or combinations thereof), a fluorescent lamp (such as a cold cathode fluorescent lamp, a hot cathode fluorescent lamp, an external electrode fluorescent lamp, a flat florescent lamp, other fluorescent lamps, or combinations thereof), or a surface emitting light source (such as a carbon nano tube light source, a plasma light source, other light sources, or combinations thereof) or combinations thereof. The aforementioned light sources can be applied to a direct type backlight or a side emitting type backlight. For instance, if the driving circuit 230 were applied to a liquid crystal display panel, the driving circuit 230 would include the signal driving circuit 128 and the light source driving circuit 130 to drive a plurality of pixels 218 and the light source 132, respectively. If the driving circuit 230 were applied to an organic electroluminescent display, the light source would be not needed, and the driving circuit 230 would at least include the driving circuit 128 and the power supply circuit (not shown) for driving and providing the signals and power needed by the pixels 218. A circuit board (not shown) with/without at least one IC chip (not shown) can be further disposed on a portion of the non-display area 124 of the display panel 120 to electrically connect other external control devices. The circuit board can be a printed circuit board, a flexible printed circuit board, or combinations thereof.

Preferably, the photosensitive region 202 is formed on at least one side of the non-display area 124 of the display panel. According to the sixth embodiment of the present invention, as shown in FIG. 17, the photosensitive region 202 is formed on three sides of the non-display area 124, but not limited thereto. Additionally, the width from one side of the photosensitive region 202 substantially adjacent to the side of the display area 122 to another side of the photosensitive region (such as to the edge of the non-display area 124) is substantially less than or substantially equal to 0.4 mm. However, this width could be further adjusted according to the design of the product, such as adjusted for fabricating a display panel with narrower frame or larger display area.

Figure 18:
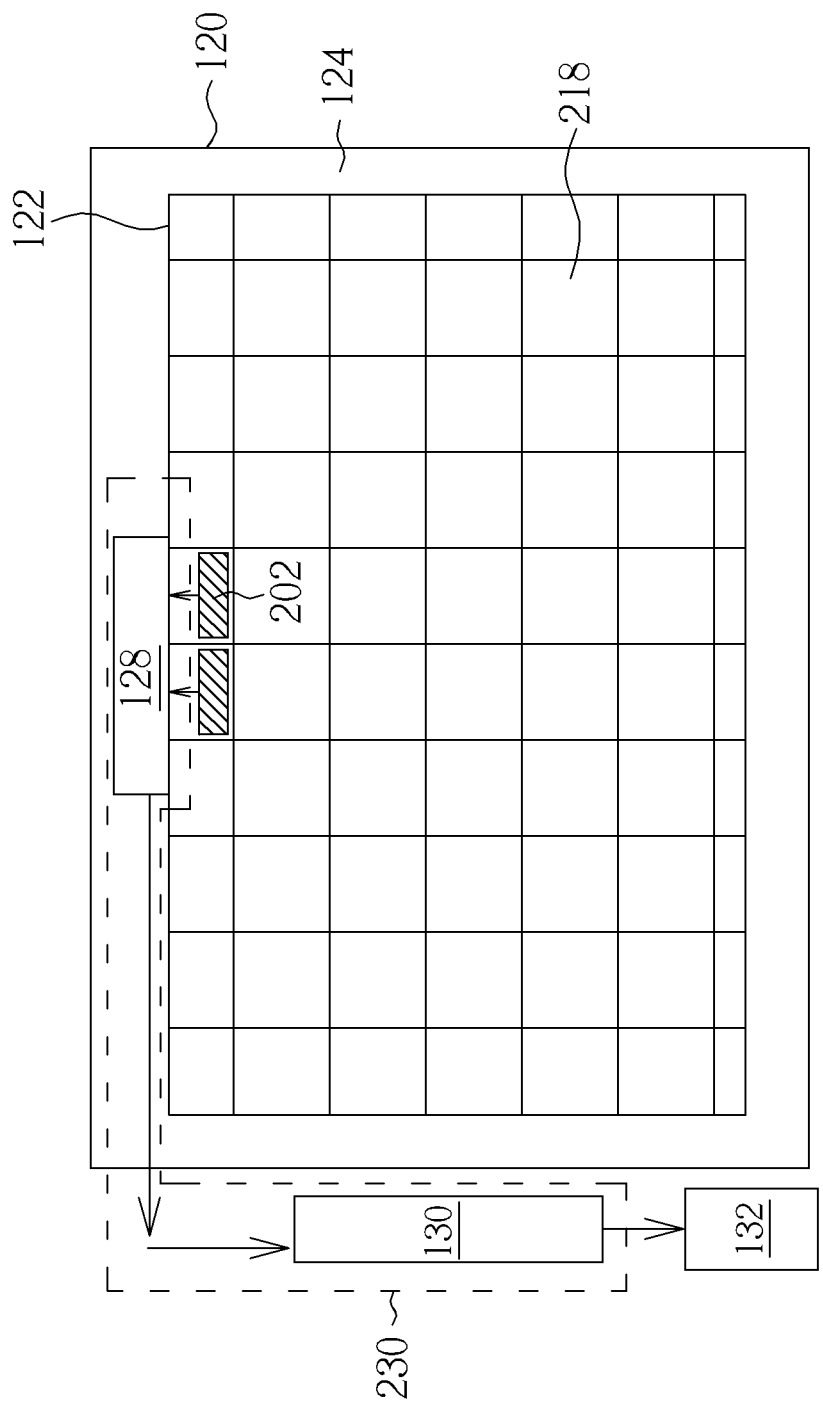
FIG. 18 illustrates a schematic view of disposing a photo detector on the display area of the display panel according to the seventh embodiment of the present invention.

By following the process disclosed in the previous embodiments for fabricating the photo detector 126, the photosensitive region 202 can be formed only within the non-display area 124, only within the display area 122, or within both the non-display area 124 and the display area 122. While the photosensitive region 202 is formed within the non-display area 124, it can be formed in at least one corner substantially near the display panel 120, substantially surrounding the display area 122, or in other locations. For instance, as shown in FIG. 17, while the photosensitive region 202 is formed in the non-display area 124, it is essentially formed to substantially surround the display area 122. Additionally, according to the seventh embodiment of the present invention, as shown in FIG. 18, the photosensitive region 202 is formed in at least portion of the pixels 218 within the display area 122 of the display panel 120. Nevertheless, the photosensitive region 202 could also be formed within every pixel 218 of the display area 122, which is within the scope of the present invention.

Preferably, in addition to using the photo detector (not shown) disposed in the photosensitive region 202 to detect light variation in the ambient environment, a sensing circuit (not shown) can be added to transmit signals to the driving circuit 230 disclosed in the aforementioned embodiments. This sensing circuit can be utilized to adjust the color detail and brightness sensitivity of the pixels 218 disposed in the display area 122, thereby improving and optimizing the image quality of the display panel 120.

Figure 19:
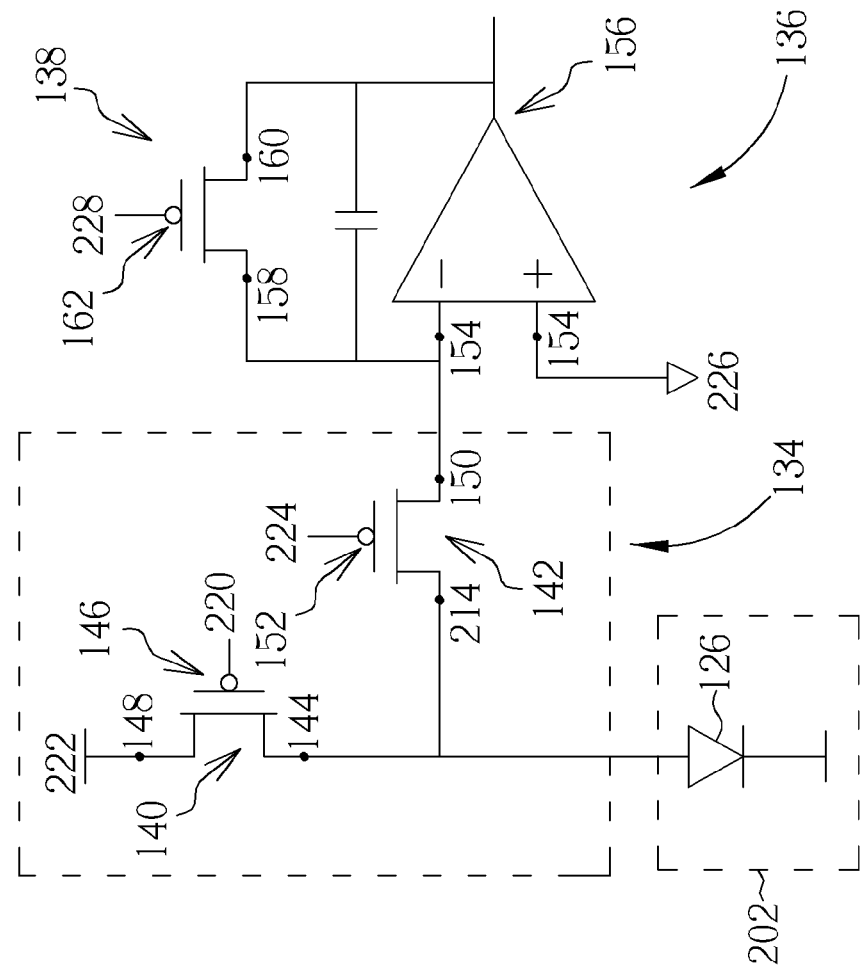
FIG. 19 illustrates a circuit diagram while disposing a photo detector on the non-display area of a display panel according to the fifth embodiment of the present invention.

Referring to FIG. 19, FIG. 19 illustrates a circuit diagram of electrically connecting a photosensitive region 202 of a photo detector to at least one sensing circuit 134. As shown in FIG. 19, the sensing circuit 134 is electrically connected to one of the two electrodes of the photo detector 126. The sensing circuit 134 has a first signal source 220, a second signal source 224, and a first voltage source 222. Preferably, the signal of the first signal source 220 is substantially different from the signal of the second signal source 224, but not limited thereto. The other electrode of the photo detector 126 is selectively connected to or not connected to another voltage source (not shown). If the other electrode of the photo detector 126 is connected to another voltage source (not shown), this voltage source is substantially different from the first voltage source 222, but can also be substantially equal to each other. In the present embodiment, only one photo detector is utilized as an example. However, the present invention could also utilize a plurality of photo detectors (such as one, two, three, or four), in which the photo detectors could be connected to each other in parallel or serial.

At least one amplifier 136 or a combination of an amplifier 136 and a first transistor 138 can be utilized with the sensing circuit 134. The amplifier 136 has two inputs 154 electrically connected to one of the two electrodes of the photo detector 126 and a reference voltage 226, and an output 156 electrically connected to a driving circuit (not shown). The first transistor 138 has a source and a drain electrodes 158, 160, in which one is electrically connected to one of the two inputs 154 of the amplifier 136, the other one of the source and the drain electrodes 158, 160 is electrically connected to the driving circuit (not shown), and a gate electrode 162 connected to a reset signal source 228. In the present embodiment, at least one of signal source from the reset signal source 228, the first signal source 220, and the second signal source 224 is substantially different from the other, but not limited thereto. In other words, the first signal source 220 can be substantially different from the second signal source 224, the reset signal source 228 can be substantially identical to the first signal source 220 or the second signal source 224, or all three signal sources are substantially different from each other, but not limited thereto.

The sensing circuit 134 of the present embodiment, for example, includes a second transistor 140 and a third transistor 142. The second transistor 140 has a source and a drain electrodes 148, 144, in which one is electrically connected to one of the two electrodes of the photo detector 126 and the other one of the source and the drain electrodes 148, 144 is connected to the first voltage source 222, and a gate electrode 146 connected to the first signal source 220. The third transistor 142 has a source and a drain electrodes 214, 150, in which one is connected to one of the two inputs 154 of the amplifier 136, and the other one of the source and the drain electrodes 214, 150 is connected to one of the two electrodes of the photo detector 126, and a gate electrode 152 connected to the second signal source 224. The circuit diagram of the present embodiment is specifically applicable for a photosensitive region formed on the non-display area of a display panel, but not limited thereto. The transistors of the present embodiment are p-type transistors. Nevertheless, the transistors can also be n-type transistors, or a combination thereof. Additionally, the sensing circuit of the present embodiment is comprised of two transistors, but not limited thereto. The number of the transistors (one, two, three, four, and so on) can be adjusted according to factors including reliability, cost, and design area of the display panel.

It should be noted that the photosensitive region 202 of the present embodiment only includes one photo detector 126 (such as the device containing substantially similar bottom gate structure disclosed in the aforementioned embodiments), and the thin film transistor (such as the device containing substantially similar top gate structure disclosed in the aforementioned embodiments) disposed in the transistor region is utilized as a thin film transistor in the sensing circuit, but not limited thereto. The photosensitive region 202 could also include two, three, four, five photo detectors 126 and/or two, three, four, five thin film transistors disposed in the photosensitive region 202 but not being utilized as thin film transistors in the sensing circuit.

Figure 20:
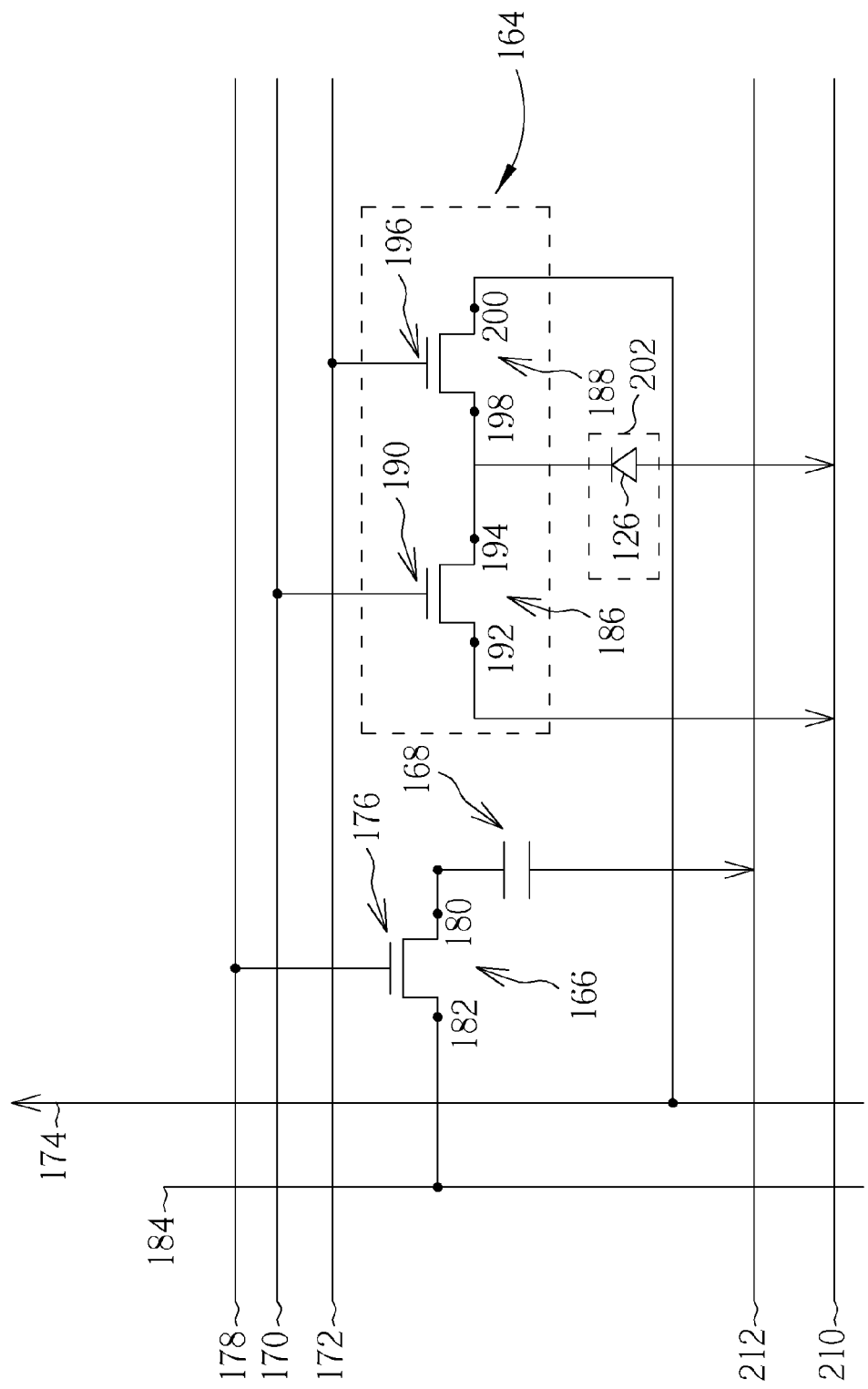
FIG. 20 illustrates a circuit diagram while disposing a photo detector on the display area of a display panel according to the seventh embodiment of the present invention.

Referring to FIG. 20, FIG. 20 illustrates a circuit diagram of electrically connecting the photosensitive region 202 and a sensing circuit 164 while the photo detector 126 is disposed in at least one portion of the pixels within the display area 122 of the display panel 120. As shown in FIG. 20, the sensing circuit 164 is disposed in at least a portion of the pixels or all of the pixels (not shown), in which the sensing circuit 164 is connected to at least one of the two electrodes of the photo detector 126 within the photosensitive region 202. The sensing circuit 164 is electrically connected to a first select line 170, a second select line 172, a first voltage source 210, and at least an amplifier 174. The sensing circuit 164 can be selectively connected to one of the first select line 170 and the second select line 172, a first voltage source 210, at least an amplifier 174, or three or more select lines.

Preferably, the pixels (not shown) within the display area (not shown) include at least one first transistor 166 and at least one capacitor 168. The number of the transistor and the capacitor could be adjusted according to the design of the product. Hence, two or more transistors and/or two or more capacitors could also be used selectively. The first transistor 166 has a gate electrode 176 connected to at least a scan line 178 and a source and a drain electrodes 182, 180 connected to a data line 184. A capacitor 168 electrically connected to the first transistor 166 could be selectively connected to at least one of the common electrode lines 212 and a portion of the scan line 178. Furthermore, if the sensing circuit 164 is electrically connected to one of the first select line 170 and the second select line 172, such as to only one of the select lines, preferably, this select line would be used as a scan line or extended from the scan line to increase the aperture ratio for the display panel. Additionally, if the sensing circuit 164 is electrically connected to the first select line 170 and the second select line 172, preferably, either the first select line 170 or the second select line 172 is used as a scan line to increase the aperture ratio.

The sensing circuit 164, for example, includes a second transistor 186 and a third transistor 188. The second transistor 186 has a gate electrode 190 connected to the first select line 170, a source and a drain electrodes 192, 194, in which one is connected to one of two electrodes of the photo detector 126 within the photosensitive region 202, and the other one of the source and the drain electrodes 192, 194 is connected to the first voltage source 210. The third transistor 188 has a gate electrode 196 connected to the second select line 172, a source and a drain electrodes 198, 200, in which one is connected to one of the two electrodes of the photo detector 126 within the photosensitive region 202, and the other one of the source and the drain electrodes 198, 200 is connected to the amplifier 174. The sensing circuit of the present embodiment is comprised of two transistors, but not limited thereto. Hence, the present invention could adjust the number of transistors (such one, two, three, four, and so on) according to the design of the product, including reliability, cost, and design area. For instance, the present invention could electrically connect one transistor to one select line, or connect three or more transistors to at least two select lines, or perform other types of connections, which are all within the scope of the present invention. Preferably, the transistor would have a gate electrode connected to the select line, a source and a drain electrodes in which one is connected to one of the two electrodes of the photo detector, and the other one of the source and the drain electrodes is connected to the amplifier 174. The transistors disclosed in the present embodiment are n-type transistors. Nevertheless, the transistors can also be p-type transistors, or a combination thereof.

Preferably, the photosensitive region 202 of the present embodiment only includes one photo detector 126 (such as the device having the substantially bottom gate like structure disclosed in the aforementioned embodiments), and the thin film transistor (such as the device containing the top gate like structure disclosed in the aforementioned embodiments) disposed in the transistor region is utilized as a thin film transistor in the sensing circuit, but not limited thereto. The photosensitive region 202 could also include two, three, four, five photo detectors 126 and/or two, three, four, five thin film transistors disposed in the photosensitive region 202 not being utilized as the thin film transistors in the sensing circuit. If the photosensitive region 202 includes at least one photo detector 126 (such as the device containing the bottom gate like structure disclosed in the aforementioned embodiments), the thin film transistor disclosed in the transistor region preferably includes at least another capacitor in the photosensitive region. This capacitor is preferably electrically connected to the aforementioned photo detector 126 and the thin film transistor.

In order to further simplify the design of the circuit and increase the aperture ratio for each pixel, an embodiment of the circuit diagram of the present invention could selectively include at least one first transistor 166, at least one scan line 178, at least one data line 184, at least one capacitor 168, at least one driving circuit 164 having at least a second thin film transistor 186, a first voltage source 210, and at least one photosensitive region 202 in the display area of the pixel (not shown). The first transistor 166 has a gate electrode 176 connected to the scan line 178 and a source or a drain electrode 182 or 180 connected to a data line 184. A capacitor 168 electrically connected to the first transistor 166 could be selectively connected to at least one of the common electrode lines 212 and a portion of the scan line 178. Preferably, the photosensitive region 202 of the present embodiment only includes one photo detector 126 (such as the device having the bottom gate like structure disclosed in the aforementioned embodiments), and the thin film transistor (such as the device containing the top gate like structure disclosed in the aforementioned embodiments) disposed in the transistor region is utilized as a thin film transistor in the sensing circuit, but not limited thereto. The photosensitive region 202 could also include two, three, four, five photo detectors 126 and/or two, three, four, five thin film transistors disposed in the photosensitive region 202 not being utilized as the thin film transistors in the sensing circuit. If the photosensitive region 202 includes at least one photo detector 126 (such as the device containing the bottom gate like structure disclosed in the aforementioned embodiments), the thin film transistor disclosed in the transistor region, preferably, further includes at least another capacitor in the photosensitive region. This capacitor is preferably electrically connected to the aforementioned photo detector 126 and the thin film transistor. If the photosensitive region 202 includes only one photo detector 126 (such as the device containing the bottom gate like structure disclosed in the aforementioned embodiments), the thin film transistor (such as the device containing the top gate like structure disclosed in the aforementioned embodiments) disposed in the transistor region is used a thin film transistor in the sensing circuit, the device having top gate structure would have a gate electrode 190 electrically connected to the scan line 178, a source and a drain electrodes 198, 200 in which one of the source and the drain electrodes 198, 200 is electrically connected to the amplifier 174, and the device containing the bottom gate structure would have a gate electrode (not shown) electrically connected to the first voltage source 210, a source and a drain electrodes (not shown) in which one is electrically connected to the first voltage source 210 and the gate electrode (not shown), and the other one of the source and the drain electrodes (not shown) electrically connected to the other one of the source and the drain electrodes 198, 200 of the device having top gate structure. In another embodiment, the number of photo detector containing device having the top gate like structure is about one, two, or three.

As shown in FIG. 21, the photo detector 126 (also referred to as photoelectric devices) within the photosensitive region could be applied to devices other than the display panel disclosed in the aforementioned embodiments, such as solar cells, charge coupled devices (CCD), devices having touch functions (such as touch panels), other devices, or any two combinations thereof. Preferably, the electro-optical apparatus 204 could include a display panel 120 and an electronic device 206 connected to the display panel 120. For instance, the electronic device 206 could include: control devices, operating devices, processing devices, inputting devices, memory devices, driving devices, light emitting devices, protective devices, sensing devices, detecting devices, devices of other functions, or combinations thereof. The display panel could be sub-categorized according to materials with a dielectric constant disposed between the two substrates, including liquid crystal display panels (such as transmitting display panels, semi-transmitting display panels, reflective display panels, color filter on array display panels, array on color filter display panels, vertical alignment (VA) display panels, in-plane switching (IPS) display panels, multi-domain vertical alignment (MVA) display panels, twisted nematic (TN) display panels, super twisted nematic (STN) display panels, patterned vertical alignment (PVA) display panels, super patterned vertical alignment (S-PVA) display panels, advanced super view (ASV) display panels, fringe field switching (FFS) display panels, continuous pinwheel alignment (CPA) display panels, axially symmetric aligned microcell (ASM) display panels, optically compensated birefringence (OCB) display panels, super in-plane switching (S-IPS) display panels, advanced super in-plane switching (AS-IPS) display panels, ultra fringe-field switching (UFFS) display panels, polymer stabilized alignment display panels (PSA), dual-view display panels, triple-view display panels, three-dimensional display panels, other display panels, or combinations thereof), organic electroluminescent display panels (such as fluorescent organic electroluminescent display panels, phosphoric organic electroluminescent display panels, or combinations thereof), or combinations thereof. Preferably, the organic material utilized in the organic electroluminescent display panels include micromolecular light emitting materials, macromolecular light emitting materials, or combinations thereof. If the display panel were to be a liquid crystal display panel, the pixels (not shown) of the display region disclosed in the aforementioned embodiments not only includes at least one capacitor, but also includes at least one liquid crystal capacitor, which is preferably composed of the first portion 84 of the patterned conductive layer, the liquid crystal layer, and the common electrode disposed on the opposite substrate. The display panel could be applied to portable products such as cellular phones, video recorders, notebook computers, game machines, watches, music players, email receivers, electronic photo frames, global positioning system, or similar products, audio and video products such as video players or similar products, monitors, televisions, indoor and/or outdoor billboards, guiding devices, and display panel of projectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display panel, having a display area and a non-display area, comprising:
    a plurality of pixels disposed in the display area;
    at least one driving circuit electrically connected to the pixels; and
    at least one photosensitive region having at least one photo detector electrically connected to the at least one driving circuit, the at least one photo detector, comprising:
    a substrate having a transistor region and a photosensitive region;
    a first patterned semiconductor layer disposed on the transistor region of the substrate, wherein the first patterned semiconductor layer comprises a first doping region and a second doping region;
    a dielectric layer covering the first patterned semiconductor layer of the transistor region, the photosensitive region, and the substrate;
    a first patterned conductive layer formed on the dielectric layer of the transistor region and on the dielectric layer of the photosensitive region;
    an interlayer dielectric layer covering the dielectric layer and the first patterned conductive layer, wherein the interlayer dielectric layer comprises at least two openings to expose a portion of the first doping region of the first patterned semiconductor layer and a portion of the second doping region of the first patterned semiconductor layer;
    a second patterned semiconductor layer disposed on the interlayer dielectric layer of the photosensitive region;
    two first electrodes formed on the interlayer dielectric layer and electrically connected with the first patterned semiconductor layer via the at least two openings respectively; and
    two second electrodes formed on the portion of the second patterned semiconductor layer.

2. The display panel of claim 1, wherein the first patterned semiconductor layer has a first crystal state, the second patterned semiconductor layer has a second crystal state, and the first crystal state is different from the second crystal state.

3. The display panel of claim 1, further comprising a patterned passivation layer covering the interlayer dielectric layer and the first and the second electrodes.

4. The display panel of claim 3, further comprising a second patterned conductive layer having a first potion and a second portion formed on the patterned passivation layer of the transistor region and the patterned passivation layer of the photosensitive region, wherein the first portion is electrically connected to one of the first electrodes of the transistor region and the second portion is substantially disposed between the two second electrodes of the photosensitive region.

5. The display panel of claim 4, wherein the edge of one of the two second electrodes and an edge of the second portion are separated by a first distance and the edge of the other one of the two second electrodes and the other edge of the second portion are separated by a second distance.

6. The display panel of claim 5, wherein the ratio between the first distance and the second distance is 0 to about 7.5.

7. The display panel of claim 4, wherein the second portion is electrically connected to a voltage source.

8. The display panel of claim 4, wherein the second portion is electrically connected to at least one of the patterned conductive layers of the photosensitive region and one of the second electrodes.

9. The display panel of claim 1, further comprising at least one storage capacitor electrically connected to one of the first electrodes of the transistor region.

10. The display panel of claim 1, comprising:
- a sensing circuit electrically connected to one of the two electrodes of the at least one photo detector within the at least photosensitive region, a first signal source, a second signal source, and a first voltage source;
- an amplifier having two inputs electrically connected to one of the two electrodes of the at least one photo detector within the at least one photosensitive region and a reference voltage, and an output electrically connected to the driving circuit; and
- a first transistor having a source/drain electrode electrically connected to one of the two inputs of the amplifier, another source/drain electrode electrically connected to the driving circuit, and a gate electrode electrically connected to a reset signal source.

11. The display panel of claim 1, wherein the at least one photosensitive region is disposed within at least portion of the pixels of the display area.

12. The display panel of claim 11, further comprising:
- a sensing circuit disposed within at least one portion of the pixels and electrically connected to at least one select line, a first voltage source, at least one amplifier, and one of the two electrodes of the at least one photo detector within the at least one photosensitive region;
- a first transistor disposed within each one of the pixels, wherein the first transistor comprises a source electrode, a gate electrode electrically connected to one data line, and a drain electrode electrically connected to a scan line, and
- at least one capacitor electrically connected to the first transistor.

* * * * *